United States Patent [19]
Wiley et al.

[11] Patent Number: 6,031,354
[45] Date of Patent: Feb. 29, 2000

[54] ON-LINE BATTERY MANAGEMENT AND MONITORING SYSTEM AND METHOD

[75] Inventors: Paris H. Wiley, Tampa, Fla.; Antonios G. Sideris, Marietta, Ga.; Elias K. Stefanakos, Tampa, Fla.; Michael Priven, Blairsville, Ga.

[73] Assignee: AIMS Systems, Inc., Knoxville, Tenn.

[21] Appl. No.: 08/989,781

[22] Filed: Dec. 12, 1997

Related U.S. Application Data

[63] Continuation-in-part of application No. 08/595,304, Feb. 1, 1996, Pat. No. 5,710,503.

[51] Int. Cl.$^7$ ........................ H01M 10/44; H01M 10/46; H01M 10/48
[52] U.S. Cl. .................. 320/116; 320/132; 320/DIG. 21
[58] Field of Search ...................................... 320/116, 119, 320/132, 134, 136, DIG. 18, DIG. 21, FOR 105, FOR 114, FOR 142, FOR 147; 324/426, 434, 433

[56] References Cited

U.S. PATENT DOCUMENTS

| | | | |
|---|---|---|---|
| 4,392,102 | 7/1983 | Sugalski et al. | 320/DIG. 21 X |
| 4,707,795 | 11/1987 | Alber et al. | 324/433 |
| 5,321,626 | 6/1994 | Palladino | 324/432 |
| 5,349,535 | 9/1994 | Gupta | 320/106 |
| 5,506,572 | 4/1996 | Hills et al. | 320/DIG. 21 X |
| 5,565,759 | 10/1996 | Dunstan | 320/DIG. 21 X |
| 5,652,498 | 7/1997 | Edye et al. | 320/DIG. 21 X |

*Primary Examiner*—Edward H. Tso
*Attorney, Agent, or Firm*—Joseph G. Seeber

[57] ABSTRACT

An on-line battery management and monitoring system and method for monitoring a plurality of battery cells identifies and computes individual cell and battery bank operating parameters. The system comprises a central monitoring station to which a plurality of controllers is connected, each controller having a plurality of battery cells which it monitors. Features of the invention include the following: display of measurement and alarm condition data for each of the battery cells connected to each of the controllers; color-coded display of data for a battery cell, the display color being dependent upon the condition of the battery; performance of data analysis and initiation of necessary maintenance requests; operation of the controllers in an automatic local mode, automatic remote mode, or maintenance mode; provision for periodic calls from the controllers to the central monitoring station; and generation of red alarm calls, yellow alarm calls, downscale alarm calls, and diagnostic calls between the central monitoring station and the controllers.

36 Claims, 33 Drawing Sheets

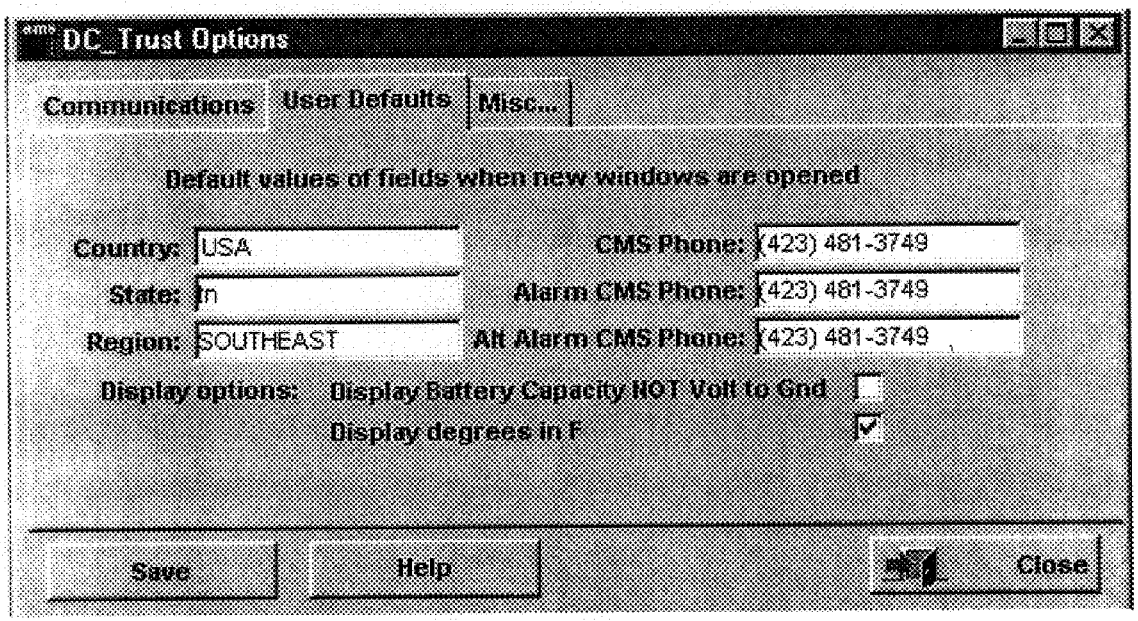
FIG. 12U(2)
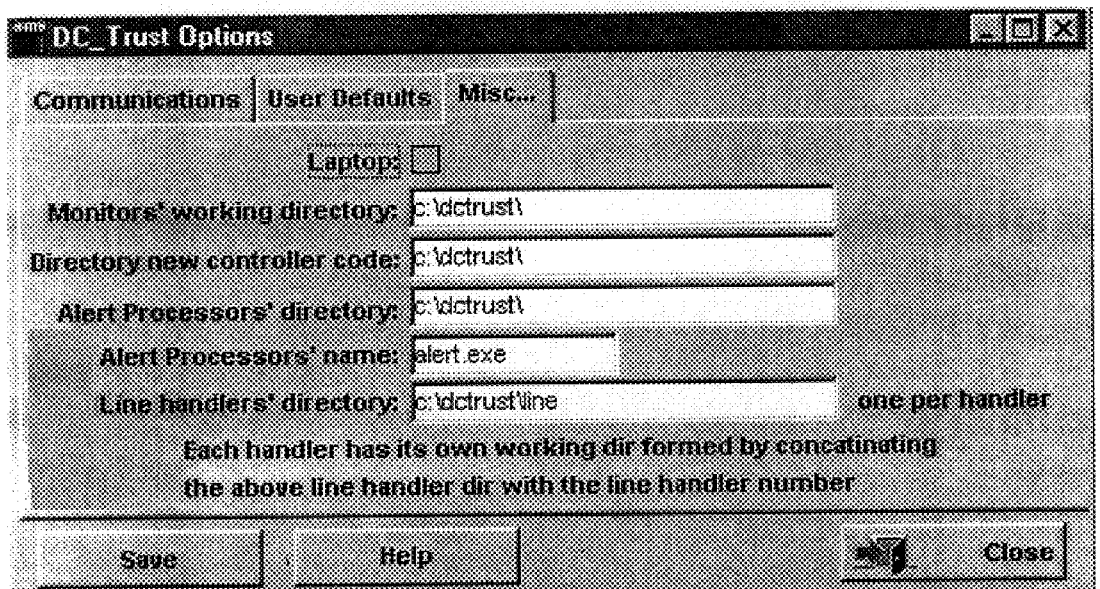
FIG. 12U(3)

ON-LINE BATTERY MANAGEMENT AND MONITORING SYSTEM AND METHOD

REFERENCE TO RELATED APPLICATION

This is a continuation-in-part of application Ser. No. 08/595,304 filed on Feb. 1, 1996, entitled "On-Line Battery Monitoring System", and assigned to the assignee of the present invention.

TECHNICAL FIELD

The present invention generally relates to an on-line battery management and monitoring system and method, and more particularly an emergency battery on-line management and monitoring system and method which are capable of identifying and computing individual cell and battery bank operating parameters by means of a relatively simple, non-intrusive, fully electronic, remote battery management and monitoring system which does not require the use of probes or other measuring instruments. Moreover, the on-line battery management and monitoring system operates under software control, and the uniqueness and novelty of the software resides in the provision of a user-friendly system and method for displaying, in an instantaneous and efficient manner, battery condition for any battery or bank of batteries, such condition being displayed in a color-coded, user friendly manner.

BACKGROUND ART

Lead acid and calcium batteries have been in use in industrial plants for more than a hundred years. Such batteries are usually arranged in banks of individual cells of 2, 4, 6, 8 and 12 VDC (volts direct current), and such banks of batteries typically power direct current emergency buses which are normally rated from 48 VDC up to 540 VDC. Industrial batteries are simple, chemical reaction devices, but their operating characteristics are relatively complex and vary considerably because they are dependent upon battery construction, manufacturing material and processes, ambient temperatures, aging, use and other factors.

A relative newcomer to the battery industry is the valve regulated lead acid (VRLA) battery technology utilized extensively in 48 VDC applications within the communications industry. VRLA batteries are used because they are smaller, lighter and require less maintenance than conventional flooded lead acid cells. However, VRLA batteries are less durable and are more sensitive to high temperature conditions and improper charging, and this has led to premature failures of the VRLA batteries in many applications.

As a result of the foregoing considerations, periodic surveillance testing methods have been utilized to ensure that battery cells and banks are and remain in a condition of operational readiness. Such testing methods are dependent on periodic measurement of the float charge at the battery terminals, charger output current and voltage, electrolyte levels, cell temperatures, pilot cell voltage and specific gravity, and such testing is also dependent on periodic discharge testing of the battery bank. However, this type of surveillance has several inherent problems: it is very labor intensive, and thus very expensive to perform; its accuracy is not always dependable since it relies on inaccurate instruments and techniques which do not always compensate for such parameters as temperature, aging, environmental factors, and specific charge-discharge characteristics; load testing usually requires disconnection of the emergency battery bank from its critical load and also on drawing the battery state of charge to very low levels; load testing of the battery bank is the only way to ensure battery performance and is the best way to detect cable continuity and degradation of material because of oxidation or other chemical deterioration, and thus the reliability of the system is virtually unknown between tests; trend analysis of cell operational parameters is not performed during load testing (for example, when temperatures are abnormally increasing, internal cell faults may go unnoticed); there is no accurate indicator to predict that, after a full load testing, each battery cell will perform the same as before the test.

In evaluating systems of the prior art, it is important to note that the measurement of cell conductance or open-circuit voltage does not provide a good indication of battery capacity or ability to carry a load for a predetermined time. A half-discharged battery may show a voltage near to its full charge after a period of rest, and any correlation between cell conductance and capacity is speculative.

Finally, there have been two ways in the prior art to calculate accurately the state of charge: the "rate dependent capacity" method and the "model based" method. Both of these methods require the measurement of operational parameters, such as voltage, specific gravity of the electrolyte, temperature, transient discharges, battery specific characteristics, and other parameters. Moreover, both of these methods are labor intensive, and require local battery surveillance and maintenance.

Therefore, there is a need in the prior art for an on-line battery management and monitoring system and method which ensure readiness and reliability of UPS and emergency battery systems, while eliminating labor intensive surveillance testing, extending the life of the cells, and allowing for remote monitoring and testing of emergency battery systems. There is also a need in the prior art for such an on-line battery management and monitoring system and method which perform these services with high accuracy and reliability while never removing the batteries from their normal service.

There is also a need in the prior art for the development of an on-line battery management and monitoring system and method which perform non-intrusive testing, accurately and remotely monitors the condition and operability of industrial UPS and emergency battery systems, and automatically determines the following conditions for individual cells and battery banks: state of charge, capacity, location and magnitude of grounds, location and magnitude of connection degradation, and internal cell faults and degrading conditions.

Furthermore, there is a need in the prior art for the development of an on-line battery management and monitoring system and method which function under software control, and which provide a user-friendly system for instantaneously and efficiently displaying battery health in a manner which can be immediately recognized by the operator, and wherein instantaneous transition from one part to another part of the software-controlled system is possible.

The following patents are considered to be representative of the prior art relative to the invention disclosed herein: U.S. Pat. Nos. 4,707,795; 4,888,716; 5,027,294; 5,047,961; 5,193,067; 5,268,845; 5,287,286; 5,295,078; 5,311,441; 5,321,626; 5,349,535; and 5,450,007. However, none of the patents cited above provides the capabilities or functions provided by the system and method of the present invention. For example, the systems previously disclosed do not perform some or all of the following functions: battery bank capacity testing, battery cell capacity testing, accurate calculation of individual cell SOC, non-intrusive cell electrolyte level indication, leakage resistance testing to earth ground, and customized battery monitoring. Other features not disclosed in the prior art will become evident from the detailed disclosure set forth below.

DISCLOSURE OF INVENTION

The present invention generally relates to an on-line battery management and monitoring system and method, and more particularly, an emergency battery on-line management and monitoring system and method which are capable of identifying and computing individual cell and battery bank operating parameters with a simple, non-intrusive, fully electronic, remote monitoring system which does not require the use of probes or other measuring instruments. In general, the monitoring system and method of the present invention provide continuous or periodic operability information on each battery cell within a bank of battery cells, including state of charge (SOC), internal faults, and magnitude and location of both grounds and degraded connections. The system and method of the present invention perform a short periodic load test to assess bank integrity and to provide data to compute capacity and to independently verify the SOC. In accordance with the present invention, the batteries are charged only when needed, thus increasing the remaining cell lives of the batteries and extending new cells lives beyond normal expectations. Furthermore, the inventive system and method compute the SOC and the capacity of each cell and each bank at periodic intervals with high accuracy so as to determine charging or preventive maintenance needs.

In addition, the battery management and monitoring system and method of the present invention ensure the readiness and reliability of emergency battery systems, while also eliminating labor-intensive surveillance testing, extending the life of the cells, and allowing for the remote monitoring and testing of emergency battery systems. These functions are performed with relatively high accuracy and reliability, and without ever removing the batteries from their normal service. The system and method of the present invention employ non-intrusive testing for the accurate and remote monitoring of the condition and operability of industrial emergency battery systems, and automatically determine the following conditions for individual cells and battery banks: SOC, capacity, location and magnitude of grounds, location and magnitude of connection degradation, and internal cell faults and degrading conditions.

The inventive system and method, due to high accuracy, are able to manage battery bank charging, thereby eliminating the need for continuous floating charge, and consequently extending the life of cells. The system of the present invention uses no additional probes or instrumentation, is 100 percent non-intrusive, and performs its functions without removing the batteries from service.

Other features of the inventive battery management and monitoring system and method include the following: immediate local and remote alarm generation for out-of-limit parameters and down-scale conditions; extremely high accuracy (better than 98 percent) on all measurements and in its calculation of SOC for each battery cell, or for the bank as a whole, calculated by two independent methods; automatic operation of contactors and relays needed to configure the battery bank for testing or charging; flexible operating modes which can be entered manually or remotely, including the provision of programmable tests schedules, periodicities, changes of set points, and changes to the programming code; accurate and reliable data for the calculation of cell and bank degradation for the determination of predictive maintenance and preventive maintenance needs; and centralization of system operation, data acquisition, and data analysis in one location for an entire power plant system, industrial complex or telecommunications system.

The on-line battery management and monitoring system and method of the present invention, as disclosed herein, achieve significant savings as a result of their ability to greatly increase the operational reliability of the DC emergency bus, ensuring that the bus is available to power critical systems in the event of a loss of normal power. The consequences of a total black-out on health and safety or business losses, as well as the cost of recovery of certain processes after such an event has occurred, readily justifies the installation of the system of the present invention. The savings achieved by the present invention can be summarized as follows: significant improvement in the reliability of the emergency battery bank; reduction and prediction of cell failures; an increase in cell life through charge management; a reduction in labor and maintenance costs normally required for battery surveillance, maintenance, troubleshooting and replacement; the generation of alarms indicating cell failures or out-of-spec conditions; the provision of an early indication of a degrading battery cell capacity and/or system ground faults; the elimination of labor-intensive, intrusive, periodic surveillance testing; and improvement in the ability to determine battery service and replacement requirements. In addition, the invention eliminates the need for manual testing of cell voltage measurements, cell specific gravity measurements, cell temperature measurements, float voltage measurements at the battery terminals, battery impedance or conductance testing, connection resistance measurements, and performance load testing.

Finally, the on-line battery management and monitoring system and method of the present invention employ unique software which provides the following advantages: depiction of the measured and calculated values for individual batteries and battery banks in a color-coded, user-friendly manner (employing colored bar graphs) so that the health of the battery can be instantaneously recognized by an operator; instantaneous transitioning from one part to another part of the software system without disruption to on-line actions (for example, while on-line with a remote controller, the user can access historical data, analyze data, change configurations, and change set points, all of these capabilities being available simultaneously); highly accurate and rapid calculation of SOC and capacity in a non-intrusive manner (i.e., without the insertion of any probes into the battery and without removal of the batteries from the active load no matter what the current mode of operation of the system is); provision of historical performance data for each battery cell (or bank) from initial operation of the battery to the end of operation thereof, and use of the data so obtained for reliability analysis; and provision of statistical analysis in the form of counters for all system operations which, in turn, denotes battery operating behavior and system operating behavior.

Therefore, it is a primary object of the present invention to provide an on-line battery management and monitoring system and method.

It is an additional object of the present invention to provide a battery on-line management and monitoring system and method which are capable of identifying and computing individual cell and battery bank operating parameters.

It is an additional object of the present invention to provide an on-line battery management and monitoring system and method which employ a simple, non-intrusive, fully electronic, remote monitoring system.

It is an additional object of the present invention to provide an on-line battery management and monitoring system and method which do not require the use of probes or other measuring instruments.

It is an additional object of the present invention to provide an on-line battery management and monitoring system and method which provide continuous or periodic operability information on each battery cell, including SOC, internal faults, and magnitude and location of both ground faults and degraded connections.

It is an additional object of the present invention to provide an on-line battery management and monitoring system and method which perform periodic load testing to assess battery bank capacity and to provide data to compute the capacity and to independently verify the SOC.

It is an additional object of the present invention to provide an on-line battery management and monitoring system and method which eliminate the need for continuous floating charge, and consequently extends the life of battery cells.

It is an additional object of the present invention to provide an on-line battery management and monitoring system and method which operate under software control to provide a user-friendly, rapid system for display, in a colored-coded manner, of the health of a battery so that it can be instantaneously recognized by the operator.

It is an additional object of the present invention to provide an on-line battery management and monitoring system and method which transition instantaneously from one part to another part of the software without disruption to on-line actions.

It is an additional object of the present invention to provide for dynamic reconfiguration of graph data based on data stored at a controller and maintained in a central monitoring system, thereby allowing monitoring of heterogeneous battery systems from the central monitoring system, and allowing for remote maintenance and troubleshooting from a central point.

The above and other objects, and the nature of the invention, will be more clearly understood by reference to the following detailed description, the associated drawings, and the appended claims.

BEST MODE FOR CARRYING OUT THE INVENTION

The invention will now be described in more detail with reference to the various figures of the drawings. However, prior to describing the invention, several terms should be defined, as follows:

Alarm—a visual and/or audible indication resulting from any one of the monitored parameters of an individual cell exceeding (or falling below) a predetermined set point. In visual terms, green means that all is well with the individual cell; yellow denotes a degrading condition; and red means a possible failure of the cell. Thus, each monitored parameter may have two set point values, a red alarm value and a yellow alarm value. Exceeding a red alarm value results in the controller alarming immediately, while the yellow alarm set points are saved and compared to previously saved test data.

Capacity—the discharge current, measured in amperes, multiplied by the length of time that the battery can deliver current to the connected load before dropping below a specific, acceptable voltage. Units of capacity are ampere-hours (AH).

Central Monitoring System (CMS)—this is the software-controlled system that processes calls, requests and information from an individual controller or individual controllers.

Controller—this refers to a set of components which are utilized, at remote locations (that is, remote from the CMS), to monitor and manage emergency battery systems. Each remote controller comprises a controller unit, a multiplexer and load unit (including a resistive load), a switch panel, and associated peripheral units (e.g., modem and analog-to-digital (A/D) card).

Down Scale Alarm (DSA)—indicates a problem with a controller unit or connections to the batteries serviced by a controller unit, the problem preventing accurate battery monitoring and testing.

Periodic Call—a call at a predetermined period or on a predetermined time schedule transmitting routine test cycle data to the CMS.

State of Charge (SOC)—the state of charge of an individual cell, a battery or a bank of batteries.

Test Cycle—the user-defined frequency at which the individual controller tests its batteries; also called the "sampling cycle" or "sampling frequency".

Figure 1:
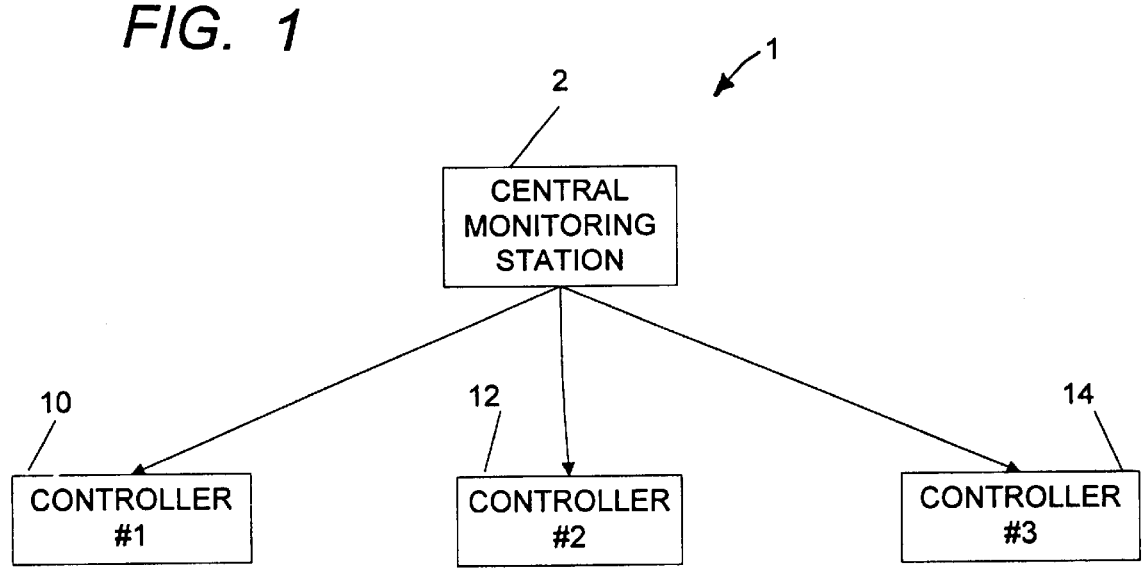
FIG. 1 is a general block diagram of the on-line battery management and monitoring system of the present invention.

FIG. 1 is a general block diagram of the on-line battery management and monitoring system of the present invention. As seen therein, the on-line battery management and monitoring system 1 basically comprises a central monitoring system (CMS) 2 to which individual controllers 10, 12 and 14 are connected. Each individual controller 10, 12 and 14 is monitored and controlled by the CMS 2.

Figure 2:
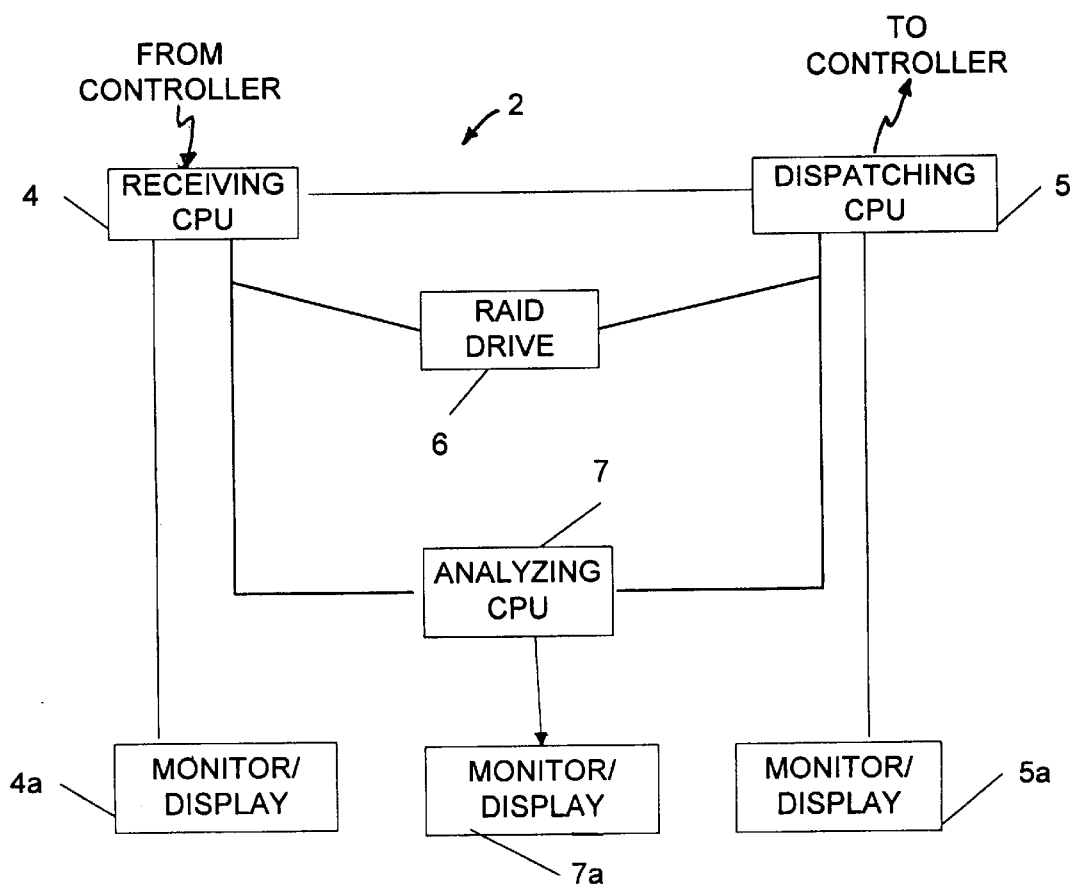
FIG. 2 is a block diagram of the central monitoring system of FIG. 1.

FIG. 2 is a block diagram of the central monitoring system of FIG. 1. As seen therein, the CMS 2 comprises a receiving central processing unit (CPU) 4, a dispatching CPU 5, RAID (redundant array of inexpensive disks) drive 6, and an analyzing CPU 7.

The receiving CPU 4 is connected to receive signals from individual controllers 10, 12 and 14 (FIG. 1), while the dispatching CPU 5 is connected to transmit signals to the individual controllers 10, 12 and 14. The analyzing CPU 7 performs various analysis functions based on data received from CPU's 4 and/or 5. Preferably, CPU's 4, 5 and 7 are each implemented by, at the minimum, a Pentium processor having suitable internal memory (e.g., 128 megabyte random access memory (RAM)) and a suitable hard drive. Each CPU 4, 5 and 7 is also, preferably, provided with appropriate modem equipment, serial cards, a high resolution monitor 4a, 5a and 7a, respectively, compact disk read-only memory (CDROM) drives, floppy drives, PCMCIA slots, data lines, data-quality phone lines, and a battery UPS system capable of sustaining operations for two hours.

Thus, the CMS 2 includes three fully redundant Pentium processors 4, 5 and 7 operating on an appropriate network, such as a Windows NT network. In the latter regard, the term "redundant" means that, while each of the CPU's 4, 5 and 7 performs specific functions, each is capable of performing all CMS functions if necessary. In accordance with the invention, CMS functionality is distributed across the three processors to the extent possible to minimize the impact of equipment failure on operational capabilities, and to maximize the reliability of the CMS 2.

Each controller 10, 12 and 14 (FIG. 1) preferably connects to the CMS 2 (known as the "server") via appropriate remote access server software, such as Windows NT Remote Access Server (RAS). Finally, as seen in FIG. 2, the CMS 2 also includes a RAID drive (preferably, 8.4 gigabytes in size) which is used, on a shared basis, by the CPU's 4, 5 and 7.

The latter configuration provides reasonable security, and allows CPS functions to be directed by a remote operator via the RAS connection. Moreover, the disclosed configuration, as described above, can support up to 19,200 remote controllers, but can be expanded to support over 300,000 remote controllers.

The general operation of the CMS 2 will now be described with reference to FIGS. 1 and 2. Each controller 10, 12 and 14 is a fully functional personal computer or similar device which is physically connected to the batteries or battery banks connected to the particular controller. Controllers 10, 12 and 14 report battery status and alarm conditions to the CMS 2. The CMS 2 receives calls from the controllers 10, 12 and 14, performs trend analysis on data received from the controllers 10, 12 and 14, initiates necessary maintenance requests, and checks to see that all expected calls from each controller 10, 12 and 14 are received.

Controllers 10, 12 and 14 have four operating modes, and can be placed in any operating mode, either locally or remotely via a modem connection. The four controller operating modes are:

(1) Manual mode—the operator directs all of the controller functions, either locally via a keypad and liquid crystal display or a locally connected personal computer, or remotely via a modem connection to the controller.

(2) Automatic local mode—the controller performs all testing functions automatically, and sounds alarms locally. In this mode, the controller is programmed to call a phone number, such as a beeper number, to report the alarm condition.

(3) Automatic remote mode—the controller transmits periodic test results, and reports all alarms to the CMS 2.

(4) Maintenance mode—the controller suspends the saving of data for a predetermined duration while maintenance is performed on the batteries. The controller can be removed from the maintenance mode either locally or remotely without waiting for a predetermined duration of time to elapse.

The CMS 2 is subdivided into four functional (or software) modules, and is supervised by a CMS operator. The four modules are:

(1) the receiver module, preferably implemented by receiving CPU 4, which receives and manages calls via a plurality of (e.g., three) different incoming phone numbers—a "normal number" which is used for all periodic calls and alarm calls if both the alarm and alternate alarm location numbers fail to accept calls; an "alarm number" which is used for alarm calls; and an "alternate alarm location number" which is geographically separated from the alarm number and serves as a backup alarm receiver;

(2) the analyzer module, preferably implemented in analyzing CPU 7, which analyzes the collected data;

(3) the dispatcher module, preferably implemented in dispatching CPU 5, which initiates corrective action calls, maintenance requests, activation calls, and reprogramming calls; and (4) the monitoring data base (MDB) module, preferably implemented by the shared RAID drive 6, which provides data storage for all active and historical data.

In accordance with the invention, the CMS operator ensures that each of the CMS modules is functioning correctly, responds to alarm calls, and investigates any delinquent communications between the controllers 10, 12 and 14 and the CMS 2. The descriptions of the various controller functions included herein are limited to the interfaces between the controllers 10, 12 and 14 and the various CMS modules (i.e., receiver, analyzer and dispatcher) implemented in the receiving CPU 4, the analyzing CPU 7 and the dispatching CPU 5, respectively. The CMS operating requirements are grouped into three major areas: communications, process logic, and data requirements. These areas have been discussed in general above, and will now be discussed in more detail.

The communications activities and requirements for the on-line battery management and monitoring system and method will be described relative to the operational situations, the respective roles of the CMS 2 and controllers 10, 12, 14 being described for each operational situation. The three operational situations of concern are controller-initiated calls, CMS-initiated calls, and operator-initiated calls.

With respect to the first category, the controller 10, 12 or 14 only calls the CMS 2 when operating in the automatic remote mode. In that mode, the controller 10, 12 or 14 calls the CMS 2 (receiving CPU 4 of FIG. 2) in three operational situations: periodic calls, red alarms and downscale alarms.

Periodic calls are the normal calls to the CMS 2 to indicate that the controller 10, 12 or 14 has been active, to indicate that the batteries associated therewith are functioning acceptably, and to upload data collected during the preceding period. Controllers 10, 12 or 14 test the batteries associated therewith at a frequency specified by the user, such frequency being referred to as the "test cycle". Following a user-specified number of test cycles, the controller 10, 12 or 14 saves the last set of test data, the saving of a last set of test data being known as a "saved test cycle". Following a user-specified number of saved test cycles, the controller 10, 12 or 14 initiates a periodic call, each initiation of such a periodic call defining a "periodic cycle". The number of saved test cycles between periodic calls preferably does not exceed a predetermined number (e.g., 30). During a periodic call, the controller 10, 12 or 14 performs the following functions:

(1) initiates the periodic call and identifies itself to the receiving CPU 4 (FIG. 2);

(2) uploads the monthly operational data to the receiving CPU 4;

(3) verifies that the data upload was completed successfully, and waits for instructions from the CMS 2;

(4) accepts software and set point changes from the CMS 2;

(5) initiates a new test cycle;

(6) hangs up after the receiving CPU 4 terminates the call;

(7) if the receiving CPU 4 does not answer the first call, the controller 10, 12 or 14 calls repeatedly at a predetermined frequency and for a predetermined number of attempts (e.g., every ten minutes) and, if there is no answer after a predetermined number of attempts, the controller 10, 12 or 14 places the call at a lower frequency for a longer period of time (e.g., once every five hours for the next forty-eight hours); and (8) if there is still no answer during the latter expanded cycle of attempts, the controller 10, 12 or 14 switches to an alarm status by initiating a downscale alarm and calling a preset alarm number. At this point, the call logic is the same as described below with respect to "red alarm" calls except that all batteries strings remain operational (i.e., no strings are placed in standby mode). The controller 10, 12 or 14 retains the periodic test data and continues testing until it receives other instructions.

During a periodic call, the receiving CPU 4 (FIG. 2) performs the following functions:

(1) answers the phone and verifies the identity of the calling controller;

(2) receives operational data and updates the files in the MDB module;

(3) indicates to the controller successful receipt and storage of the uploaded data;

(4) grants the controller permission to clear its resident data;

(5) provides any pre-programmed software or set point changes to the controller;

(6) synchronizes clocks with the controller, and advises the controller to initiate the next monitoring cycle;

(7) terminates the call and hangs up; and (8) notifies the analyzing CPU 7 that new data has been received.

When notified by the receiving CPU 4 that new data has been received, the analyzing CPU 7 performs the following functions:

(1) saves the test data to the MDB module;

(2) screens the data for yellow alarms, a yellow alarm resulting from any of the following conditions—high differential cell temperature, high average cell temperature (ambient temperature), failure to maintain SOC, insufficient cell capacity, cell voltage to ground, inter-cell resistance (continuity), low cell voltage, low bank voltage, and any data outside of realistic operating ranges;

(3) performs a trend analysis with respect to yellow alarms to identify adverse trends (i.e., battery banks and cells that are likely to fail without corrective action);

(4) classifies the adverse condition as a "severity-2 alarm";

(5) selects the optimum corrective or investigative action for each adverse trend; and (6) saves the adverse data and trend analysis to a "problem tracking" file and notifies the dispatching CPU 5 (FIG. 2) of the problem.

When notified by the analyzing CPU 7 of the adverse trends, the dispatching CPU 5 performs the following operations:

(1) adds a report to the problem report tracking system; and (2) generates an e-mail report to the maintenance division, identifying the battery bank or cell in trouble, the parameter in question, the trend analysis, and the recommended course of action.

In the latter regard, when an adverse trend report is generated, operator action is required. In this regard, preferably, the operator checks an e-mail address every so often (e.g., every twelve hours) for severity-2 alarm reports. The operator then determines and initiates the appropriate corrective action. Corrective action may include placing a diagnostic call to the controller in question.

As mentioned above, the second type of controller-initiated call is a red alarm call. Such a call is initiated by the controller 10, 12 or 14 immediately following any test wherein a measured or calculated parameter exceeds a "red set point". Subsequently, the controller 10, 12 or 14, receiving CPU 4, analyzing CPU 7, dispatching CPU 5 and the operator take the actions indicated below.

The controller 10, 12 or 14 initiates a red alarm call when any of the following conditions occur: high differential cell temperature, failure to maintain SOC, insufficient cell capacity, cell voltage to ground, inter-cell resistance (continuity), low cell voltage, low bank voltage, or load test switch fails to close.

In response to a red alarm call caused by any of the above conditions, the controller 10, 12 or 14 will perform the following five steps:

(1) call the receiving CPU 4 on an alarm number, and identify the controller and battery bank in question;

(2) notify the receiving CPU 4 of the alarm condition and wait for acknowledgment from the receiving CPU 4;

(3) upload all data to the receiving CPU 4 and wait for the latter to acknowledge receipt of the test data (test data for this bank is retained in the controller 10, 12 or 14 until the problem is corrected to facilitate local-manual trouble shooting);

(4) hang up after the receiving CPU 4 terminates the call; and (5) if the receiving CPU does not answer the first call, the controlling CPU 4 repeatedly calls at a preset frequency for a given amount of time; if there is no answer after that period of time, the controller calls an alternate alarm location number at a predetermined frequency for a predetermined period of time; if the alternate alarm location number does not answer, the controller calls the normal number at a predetermined frequency for a given period of time; if there is still no answer, the controller repeats the entire cycle of calls at a lower frequency for a longer period of time; during the latter time, the controller continues the testing cycle for the other monitored battery banks; the test cycle interrupts and takes priority over the calling cycle.

In addition to the five actions set forth above, the controller 10, 12 or 14 performs the following specific actions for each alarm condition:

(1) high differential cell temperature—suspend charging and load testing of the battery bank, and suppress the high cell temperature alarm for a preset duration;

(2) failure to maintain SOC—continue normal test cycles and suppress the SOC alarm for a preset duration;

(3) insufficient cell capacity—continue normal test cycles and suppress the capacity alarm for a preset duration;

(4) cell voltage to ground—continue normal test cycles and suppress the ground alarm for a preset duration;

(5) inter-cell resistance (continuity)—continue normal test cycles and suppress the continuity alarm for a preset duration;

(6) low cell voltage—continue normal test cycles and suppress the low cell voltage alarm for a preset duration;

(7) low bank voltage—continue normal test cycles and suppress the low bank voltage alarm for a preset duration; and (8) failure of load test switch to close—suppress all alarms for a preset duration.

If, in any of the above eight situations, the condition in question has not normalized by the end of the preset duration, the entire alarm cycle is repeated beginning with the calling of the CMS 2.

During a red alarm call, the receiving CPU 4 performs the following functions:

(1) answers the phone and verifies the identity of the controllers and the bank in trouble;

(2) verifies receipt of the alarm condition;

(3) receives the uploaded data and verifies to the controller that the information has been received and saved;

(4) terminates the call and hangs up; and (5) notifies the analyzing CPU 7 of the alarm condition.

When notified by the receiving CPU 4 of a red alarm condition, the analyzing CPU 7 performs the following functions:

(1) looks for the simultaneous failure of two or more cells in the battery bank—the probability of simultaneous cell failures in the battery bank is low so that it is more likely a result of a hardware or continuity problem in the controller;

(2) determines the severity of the alarm (severity-1—immediate action required, severity-2—next business day);

(3) creates a problem tracking file containing the date of occurrence, the battery bank data, the alarm condition, the severity and the recommended course of action; and (4) notifies the dispatching CPU 5 of the problem.

When notified by the analyzing CPU 7 of a red alarm, the dispatching CPU 5 performs the following operations:

(1) adds a report to the problem report tracking system; and (2) performs certain operations dependent upon the severity level of the problem. For example, in the case of a severity-1 problem, the dispatching CPU 5 calls the operator pager and reports receipt of a severity-1 red alarm at the CMS 2, sounds a local alarm at the CMS 2 requiring operator acknowledgment, sequentially and repeatedly calls various numbers on a call list if the operator does not acknowledge the local alarm within five minutes, repeating that activity until the alarm is acknowledged locally or by remote access to the CMS 2, and, once the alarm is acknowledged, displays to the CMS 2 (on a display screen located at the CMS 2) the identity of the controller and the battery bank in trouble, all data relative to the alarm condition, and the recommended courses of action.

In the case of a severity-2 red alarm, the dispatching CPU 5 generates an e-mail report to maintenance, identifying the battery bank or cell in trouble, the parameter in question, the alarm condition, and the recommended course of action.

When a red alarm occurs, operator action is required. The operator response depends upon the severity of the alarm. In the case of a severity-1 alarm, the operator must acknowledge the alarm either at the CMS console or by remote access to the CMS. The operator determines and initiates the appropriate corrective action. Such corrective action may include placing a diagnostic call to the controller.

With respect to severity-2 alarms, the operator checks an e-mail address every so often (e.g., every twelve hours) for severity-2 alarm reports. If the operator determines that a severity-2 alarm report has been generated, the operator initiates appropriate corrective action, which may include placing a diagnostic call to the controller.

The third type of controller-initiated call is a downscale alarm, which is initiated by the controller whenever a condition exists that prevents accurate testing of a battery bank or cell. Any of the following conditions will result in generation of a downscale alarm (DSA) by the controller: high cell voltage, negative cell temperature, loss of continuity between the controller and BIC sections (controller continuity), common mode voltage failure, disk full, A/D card error, high ambient temperature, boot loop, charge loop, short active load, long active load, and load test loop.

In response to a DSA call caused by any of the above conditions, the controller 10, 12 or 14 will perform the following five steps:

(1) call the receiving CPU 4 on an alarm number, and identify the controller and battery bank in question;

(2) notify the receiving CPU 4 of the alarm condition and wait for acknowledgment from the receiving CPU 4;

(3) upload alarm data to the receiving CPU 4 and wait for the latter to acknowledge receipt of the data (test data for all banks is retained in the controller 10, 12 or 14 until the problem is corrected);

(4) hang up after the receiving CPU 4 terminates the call; and (5) if the receiving CPU does not answer the first call, the controlling CPU 4 repeatedly calls at a preset frequency for a given amount of time; if there is no answer after that period of time, the controller calls an alternate alarm location number at a predetermined frequency for a predetermined period of time; if the alternate alarm location number does not answer, the controller calls the normal number at a predetermined frequency for a given period of time; if there is still no answer, the controller repeats the entire cycle of calls at a lower frequency for a longer period of time; during the latter time, the controller continues tests that are not in question; the test cycle takes priority over the calling cycle.

In addition to the five actions set forth above, the controller 10, 12 or 14 performs the following specific actions for each alarm condition:

(1) high cell voltage—continue normal test cycles and suppress the high voltage alarm for a preset duration;

(2) negative cell temperature—continue normal test cycles and suppress the negative temperature alarm for a preset duration;

(3) loss of continuity between the controller and the BIC sections—controller stops saving data, stop test cycle, and suppress cell alarms for a preset duration; and (4) common made voltage failure—continue normal test cycles and suppress the common mode voltage alarm for a preset duration.

If, in any of the above eight situations, the condition in question has not normalized by the end of the preset duration, the entire alarm cycle is repeated beginning with the calling of the CMS 2.

During a DSA call, the receiving CPU 4 performs the following functions:

(1) answers the phone and verifies the identity of the controllers;

(2) verifies receipt of the DSA condition;

(3) receives the uploaded data and verifies to the controller that the information has been received;

(4) terminates the call and hangs up; and (5) notifies the analyzing CPU 7 of the alarm condition.

When notified by the receiving CPU 4 of a DSA condition, the analyzing CPU 7 performs the following functions:

(1) classifies the problem as severity-2;

(2) creates a problem tracking file containing the battery bank data, the alarm condition, the severity, and the recommended course of action; and (4) notifies the dispatching CPU 5 of the problem.

When notified by the analyzing CPU 7 of a DSA, the dispatching CPU 5 performs the following operations:

(1) adds a report to the problem report tracking system; and (2) generates an e-mail report to maintenance, identifying the controller in trouble, the DSA condition, and the recommended course of action.

When a DSA occurs, operator action is required. The operator checks an e-mail address for severity-2 alarm reports. The operator initiates appropriate corrective action, which may include placing a diagnostic call to the controller.

Each time a new controller is added to the system, the operator adds a record to the MDB module. Such record contains all of the information relative to the controller and the batteries that are monitored by that particular controller. After the MDB module has been updated with all of the required information, the operator initiates a work order to install the controller in the field.

When a controller is initially installed or following certain maintenance activities (such as replacement of batteries with a different type), a technician will call the CMS 2 operator through the controller's modem. When the operator has initiated the dispatcher program, the field technician turns the call over to the controller.

On initial startup, there is no configuration file present. When the CMS 2 (FIG. 1) starts, and attempts to read the configuration file and does not find one, it loops while awaiting a phone call from any CMS operator. The CMS 2 accepts the logon with any controller identification and password at this time. The loop will be accompanied by a series of three beeps and a flashing red status light, with the green light on the console being "off". When the call is received, the CMS 2 responds to the CMS operator with a NAK ("not acknowledge") response and a status code, indicating that no configuration file is present.

The CMS 2 responds to only a few types of manual mode commands at this point. One such command is for the downloading of the configuration file package. When the package is received, the file is read, parsed and loaded into memory. The serial number and password are captured from the configuration file, and they are placed in a newly created "SN.TXT" file. The creation of a "SN.TXT" file occurs only once for a given controller, that is, at its inital startup and its initial configuration load. When the CMS operator disconnects, the CMS 2 enters normal operation mode based on parameters specified in the configuration file.

Once the CMS 2 is operating, the special characteristics of the string(s) attached must be calculated. Performance of this function is a time-consuming and precise task which is critical to proper performance of the CMS 2. It requires that the battery strings run through a full charge sequence. This includes "charge" and "charge recovery" states. When the sequence has been completed, then and only then can an accurate specific gravity be determined for the battery string. When the specific gravity is known, entered into the CMS, and downloaded to the CMS 2 via the configuration data, then a full-load test sequence can be commenced. This full-load test sequence calculates a starting point for the battery strings, and provides a baseline for the calculation of performance of the batteries by type. Only after this test has been completed successfully, will the capacities, internal resistance and available capacity of each battery be visible to the CMS.

As mentioned above, a second type of communication between the controller 10, 12 or 14 and the CMS 2 is characterized as a CMS-initiated call. The CMS 2 initiates calls to the controller 10, 12 or 14 in order to implement preprogrammed parameter changes on the controller 10, 12 or 14 without waiting for a periodic call. All outgoing calls from the CMS 2 are made through the dispatching CPU 5.

Preprogrammed parameter change (PPC) calls are made by the dispatching CPU 5 to update or change the operational and testing parameters of one or more controllers. Operator action is required to set up a PPC call. The actual call and transmission of data to the controllers are done by the dispatching CPU 5.

When the operational or testing data from one or more controllers must be changed, the operator sets up a controller change list that includes the controllers to be updated, the parameters to be changed, and the new values for those parameters. The operator may identify the individual controllers in the controller change list by entering individual controller identifications, or by specifying a group of controllers. A group of controllers may be: all of one client's controllers, controllers for the batteries of a given manufacturer and model number, all controllers in a given geographical location, or a combination of the conditions listed above. After the controller change list has been created, the operator signals the dispatching CPU 5 to place a call to various controllers. The operator monitors the PPC call to the controllers.

When the dispatching CPU 5 is instructed by the operator to place a PPC call, the dispatching CPU 5 calls each controller in sequence. During each call to each controller, the dispatching CPU 5 verifies the identity of the controller, updates any of the controller parameters as specified in the change list, verifies the controller settings as having been updated, terminates the call and hangs up, and then updates the MDB module with the same information as provided to the controller.

When a controller receives a PPC call from the dispatching CPU 5, it receives the call, verifies that it is the proper controller to receive the call, saves and updates all set points and parameters received from the dispatching CPU 5, verifies the data received therefrom, hangs up when the dispatching CPU 5 terminals the call, and then resumes its testing cycle based on information provided to it.

The third type of communication within the on-line battery management and monitoring system and method is an operator-initiated call. The operator initiates calls to the controllers for one of three reasons: (1) query calls to controllers that miss their scheduled periodic calls; (2) diagnostic calls to controllers that have reported alarms; and (3) routine investigation calls required for operational reasons. All operator calls are placed manually through the CMS 2 or through a PC modem.

Query calls are made by the operator to controllers that miss their scheduled report to the receiving CPU 4. The following conditions result in the generation of query calls:

(1) The analyzing CPU 7 scans the MDB module every so often (e.g., every twenty-four hours) to identify controllers whose next scheduled call date is less than or equal to the current date minus 2 (i.e., the controller is forty-eight hours late with its periodic call). For each controller that meets the criteria, the analyzing CPU 7 builds a data file containing a severity-2 alarm condition, the controller name and serial number, the controller phone number, and the controller's scheduled periodic call data and time, and then generates an e-mail report with the information above, indicating that the controller is over forty-eight hours late on its periodic call.

(2) The operator checks an e-mail address every so often (e.g., every twelve hours) for severity-2 alarm reports and, whenever the operator finds a severity-2 alarm indicating that a controller is more than forty-eight hours late on a scheduled call to the receiving CPU 4, the operator calls the delinquent controller, confirms the controller's identity and status (i.e., any alarm condition), instructs the controller to report as if it were calling the receiving CPU 4, uploads and saves the controller's data to a file, instructs the receiving CPU 4 to process the file as if it were received from a controller call, and then tries to determine the reason that the controller did not report on schedule, taking appropriate corrective action. If the controller does not answer the operator's call, the operator tries to determine the status of the phone lines to the controller and, if there is no reported trouble on the phone lines, the operator initiates a maintenance work order to investigate the controller locally, and enters a report into the problem report tracking system.

(3) When a controller receives a query call from the operator, it responds as if it is connected to a local keyboard.

The second reason for initiation of an operator call to a controller involves a diagnostic call to a controller that has reported an alarm condition. The operator calls the controller manually through the CMS 2 or through a PC modem. The controller answers the call and responds as if it is connected to a local keyboard.

The third reason for operator initiation of a call to a controller is a routine investigation call. The operator calls the controller manually through the CMS 2 or through a PC modem. The controller answers the call and responds as if connected to a local keyboard.

Figure 3:
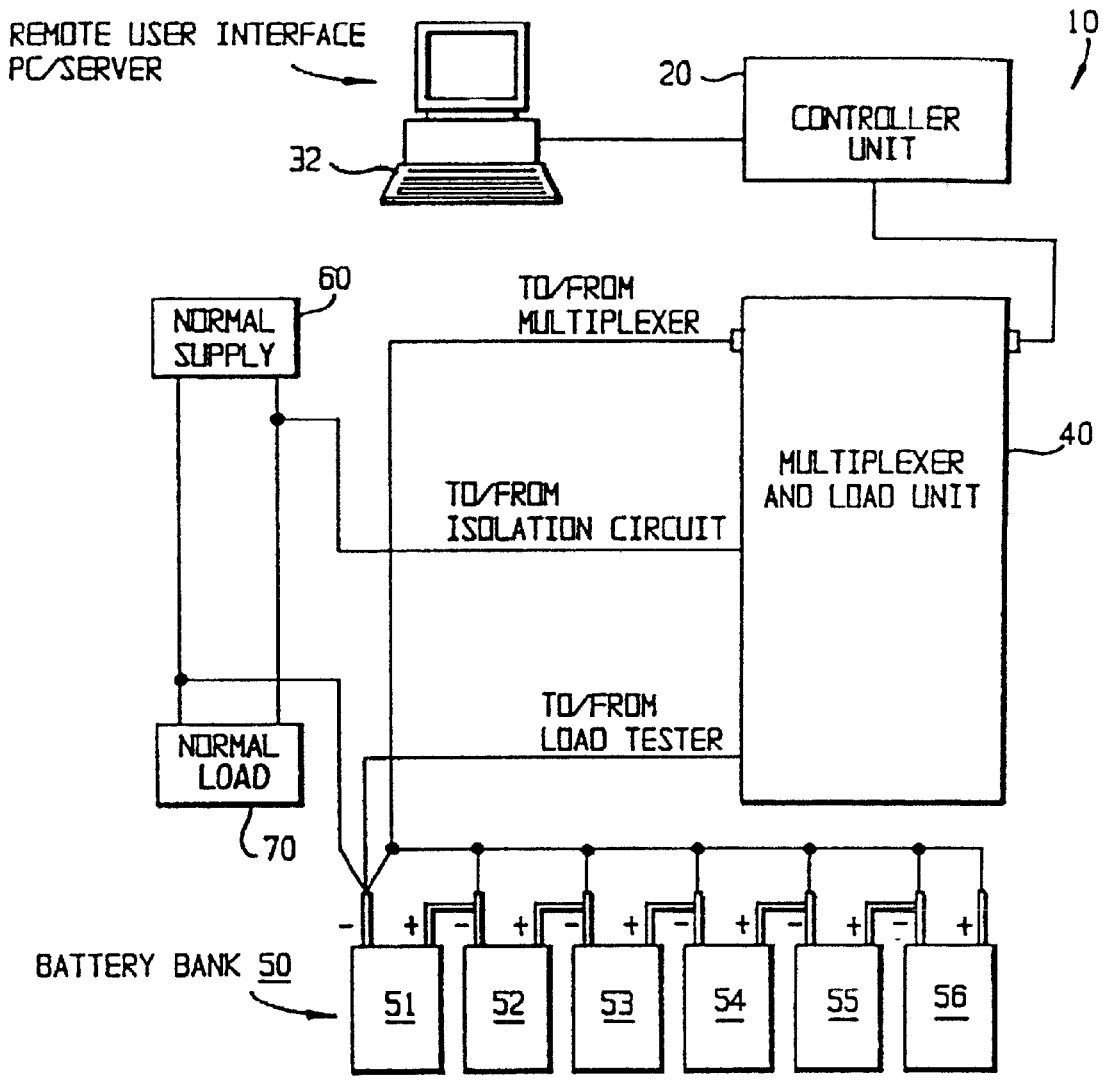
FIG. 3 is a block diagram of a controller of the on-line battery management and monitoring system of the present invention.

FIG. 3 is a block diagram of a controller of the on-line battery management and monitoring system of the present invention. As seen therein, the battery monitoring system 10 basically comprises a controller unit 20, a remote user interface (personal computer) 32, and a multiplexer and load unit 40 connected to a battery bank 50. The battery bank 50 and a normal supply 60 are connected in parallel to a normal load 70.

Controller unit 20 is the primary means for controlling the battery monitoring system 10, and in particular the multiplexer and load unit 40. Battery bank 50 comprises a plurality of battery cells 51–56 which are connected, as a back-up system, in parallel with the normal supply 60. The battery bank 50 and normal supply 60 are each connected in series with a normal load 70. In particular, the battery bank 50 is connected to the normal load 70 via an isolation circuit (not shown in FIG. 3) contained within the multiplexer and load unit 40. Multiplexer and load unit 40 also contains a load tester (also not shown in FIG. 3) which is connected to the battery bank 50 for the purpose of load testing the battery bank 50.

Figure 4:
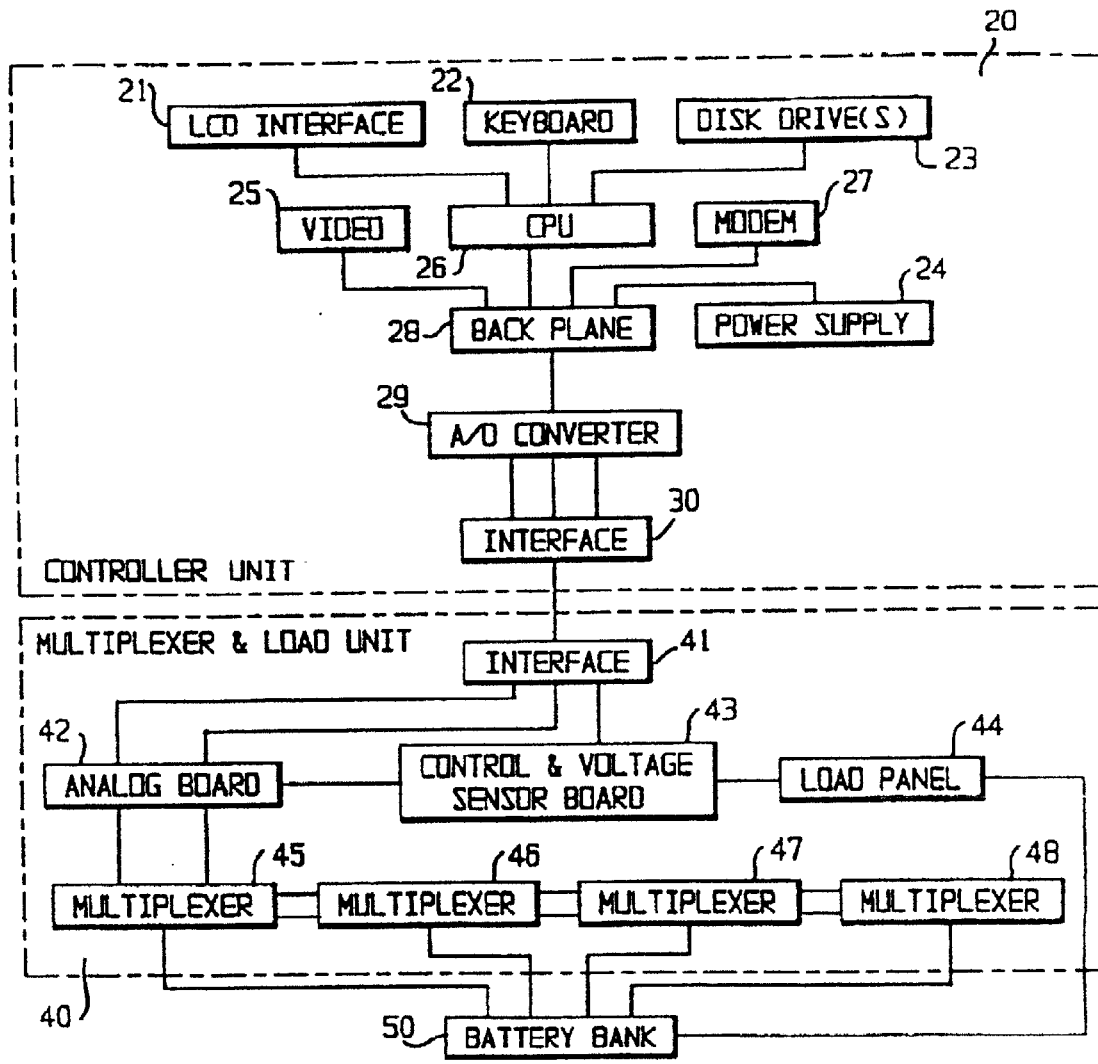
FIG. 4 is a block diagram in more detail of a controller, including multiplexer/load unit, of the battery management and monitoring system.

FIG. 4 is a block diagram in more detail of the controller unit 20 and multiplexer/load unit 40 of the battery monitoring system.

As seen in FIG. 4, controller unit 20 basically comprises liquid crystal display (LCD) interface 21, keyboard 22, disk drive(s) 23, power supply 24, video card 25, central processing unit (CPU) 26, modem 27, back plane 28, analog-to-digital (A/D) converter 29, and interface 30.

As also seen in FIG. 4, multiplexer and load unit 40 basically comprises interface 41, analog board 42, control and voltage sensor board 43, load panel 44, and multiplexers 45–48, the latter being connected to the battery bank 50.

Referring to the controller unit 20 of FIG. 4, the LCD interface 21 provides for the display of indicators relating to the various operational modes of the battery monitoring system 10—specifically, the charging mode, charge recovery mode, wait mode, load test mode, and discharge recovery mode. Keyboard 22 is employed by the user to enter data and control commands relating to the operation of the system 10. Disk drive(s) 23 are utilized to download data from the system 10 to one or more floppy disks, thereby providing another computer with the capability of examining data collected by the controller unit 20.

Continuing with a description of the controller unit 20, video card 25 provides a means for comprehensive display of all measured and calculated functions. The CPU 26 is, preferably, implemented by a 386 mother board or other suitable processing/storage component, and is utilized to process data collected by the controller unit 20 and to store data. Modem 27 is a conventional modem providing telephone communication between the controller unit 20 and an external computer, such as the remote user interface 32 shown in FIG. 1.

Further continuing with a discussion of controller unit 20, back plane 28 is a conventional internal connector device for terminating the data paths from the video card 25, CPU 26, and modem 27. Back plane 28 is also a termination device for A/D converter 29, the latter converting received analog data to digital form for processing by or storage in CPU 26. Finally, interface 30 is a conventional interface device.

Referring to multiplexer and load unit 40, interface 41 is a conventional interface device. Analog board 42 functions in a manner to be described below to provide signal conditioning and battery isolation, and produces analog outputs representing battery voltage, temperature and other measurement data. Control and voltage sensor board 43 includes a control circuit 90 (disclosed in FIG. 7 below) and voltage sensor circuitry 120 (disclosed in FIG. 8 below), the board 43 functioning to provide various control and voltage sensing functions. Load panel 44 is basically responsible for performing the load testing functions of the battery monitoring system 10.

Finally, to complete the discussion of multiplexer and load unit 40, the multiplexers 45–48 generally receive measurement data from selected batteries within the battery bank 50, and provide that measurement data to the analog board 42. In particular, in the preferred embodiment of the invention, multiplexers 45, 46 and 47 are each capable of handling eight cells within the battery bank 50, while multiplexer 48 is dedicated to the collection of other measurement data, such as battery pack voltage, and the like.

Figure 5:
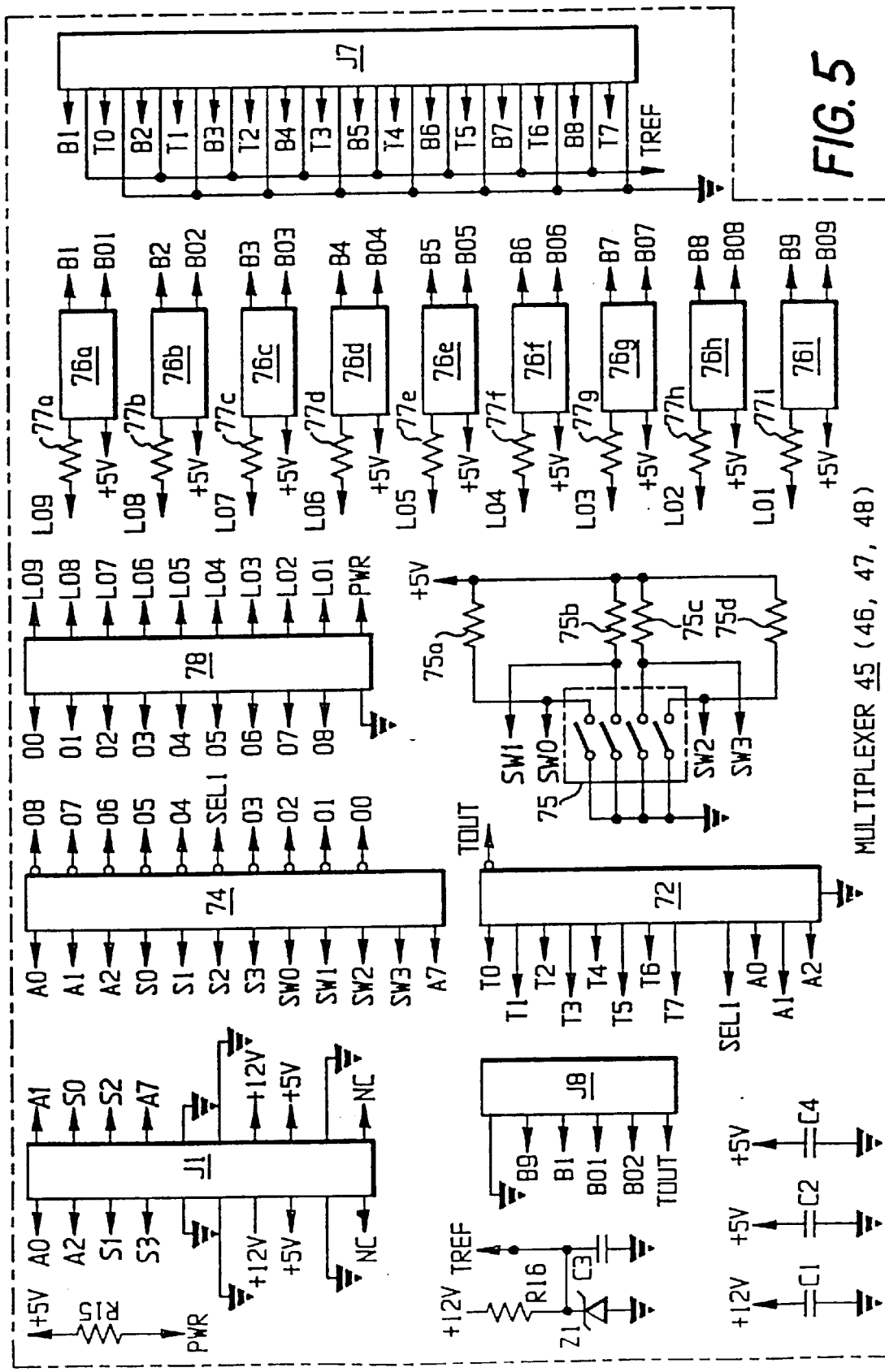
FIG. 5 is a circuit diagram of the multiplexer of the controller of FIG. 4.

FIG. 5 is a circuit diagram of the multiplexer of the battery monitoring system. That is to say, FIG. 5 is a circuit diagram of a multiplexer implemented as each of multiplexers 45–48 of FIG. 4.

As seen in FIG. 5, multiplexer 45 (46,47,48) basically comprises multiplexer 72, programmable addressable logic (PAL) 74, DIP switches 75, associated resistors 75a–75d, photo metal oxide semiconductor (MOS) relays 76a–76i, associated resistors 77a–77i, and light emitting diode (LED) bank 78.

In operation, photo MOS relays 76a–76i perform the function of selecting a desired battery from battery bank 50 (FIG. 4) for voltage and temperature measurement. Relays 76a–76i provide an "on" resistance of less than one ohm, while providing 2500-voltage isolation for the battery bank 50. The LED's in LED bank 78 are connected in series with respective relays 76a–76i via resistors 77a–77i, respectively, and provide a visual indication of the particular battery selected in battery bank 50 (FIG. 3).

Multiplexer 72 is connected, via input leads T0–T7, to thermistors (not shown) which are, in turn, connected to each battery within the battery bank 50. Thus, multiplexer 72 performs the function of selecting a corresponding thermistor input for connection, via output signal TOUT, to the analog board 42 of FIGS. 6A and 6B.

DIP switches 75 and associated resistors 75a–75d perform the function of identifying the particular multiplexer position (that is, multiplexer 45, 46, 47 or 48 of FIG. 4) implemented by the multiplexer of FIG. 5. Thus, analog board 42 identifies a particular multiplexer by examining the output provided by switches 75 on the particular multiplexer 45, 46, 47 or 48.

PAL 74 receives and decodes 8-bit address information, and then issues an output which turns on respective photo MOS relays 76a–76i, two at a time. The two photo MOS relays turned on at a given time identify two corresponding batteries at that particular point in time, thereby permitting a voltage reading to be taken across one of the batteries. For example, if two of the relays 76a–76i are turned on, and if these relays correspond to batteries 53 and 54 in battery bank 50, the voltage across battery 53 will be measured. This is due to the fact that, as seen in FIG. 3, the battery terminals are connected in series, the positive terminal of battery 53 being connected to the negative terminal of battery 54, and the negative terminal of battery 53 being connected to the positive terminal of battery 52.

Finally, when a given photo MOS relay from relays 76a–76i is activated, a corresponding output signal is provided via a respective one of the resistors 77a–77i to a corresponding one of the LED's in LED bank 78. This provides an indication to the user as to which of the batteries in battery bank 50 (FIG. 3) has been selected.

Figure 6A:
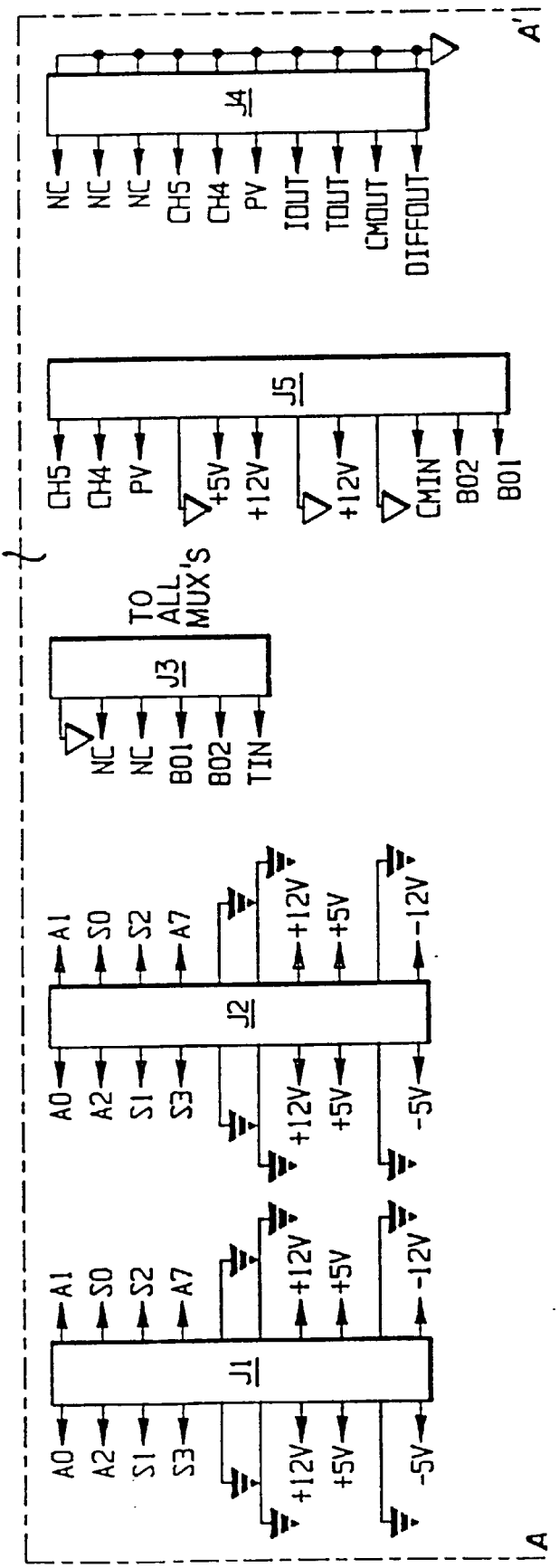
FIGS. 6A and 6B are a circuit diagram of the analog board of the controller of FIG. 4.
Figure 6B:
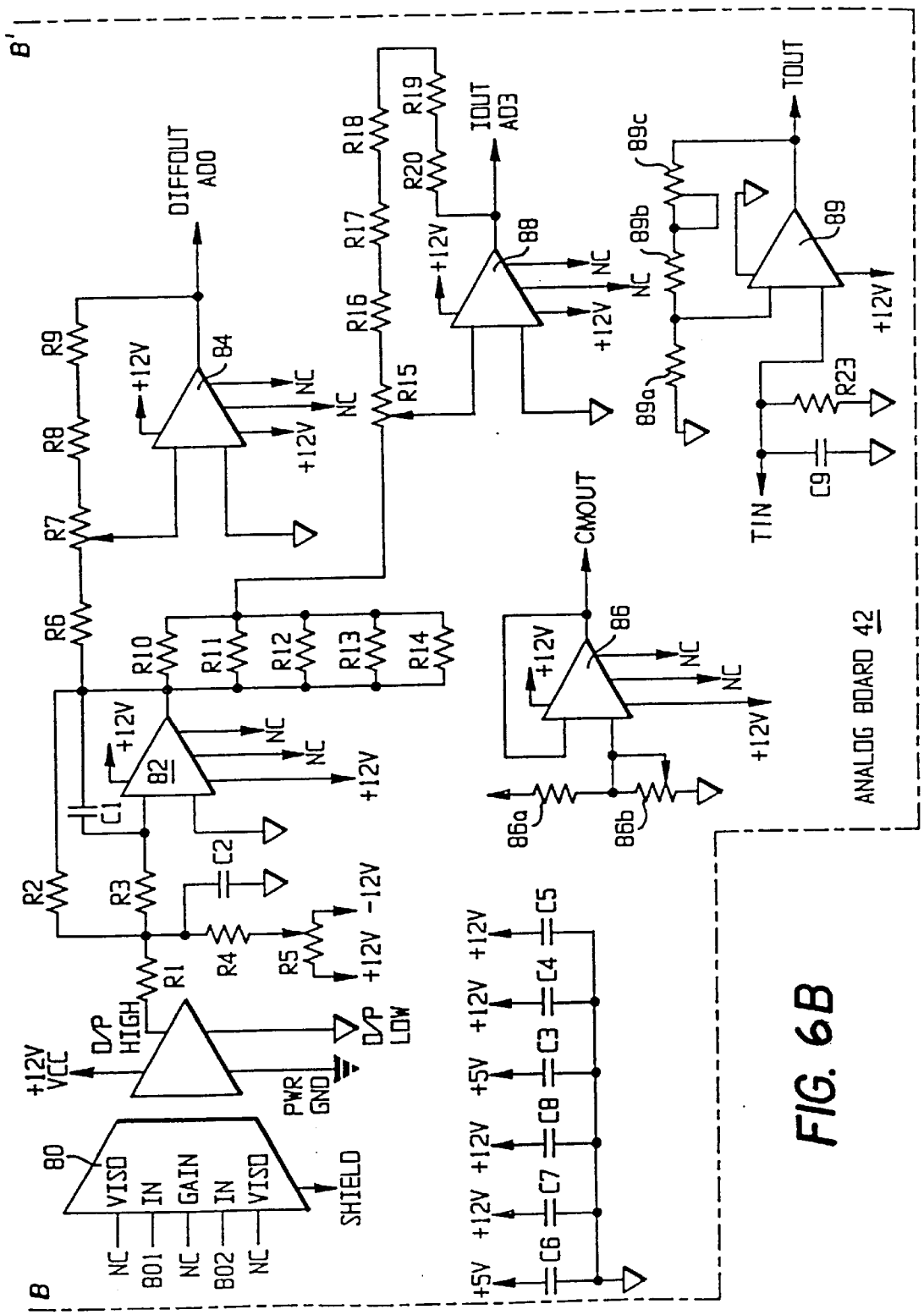

FIGS. 6A and 6B are a circuit diagram of the analog board of the battery monitoring system. As seen therein, analog board 42 basically comprises isolation amplifier 80 and operational amplifiers 82, 84, 86 and 88, with the various resistors and capacitors associated therewith and connected as shown. In addition, analog board 42 includes differential amplifier 89 with associated fixed resistors 89a and 89b and variable resistor 89c.

Isolation amplifier 80 provides electrical isolation between the inputs BO1 and BO2 from multiplexer 45, earth ground, and the voltage measurement circuitry (operational amplifiers 82, 84, 86 and 88) of the analog board 42 to prevent any faults in the analog board 42 from adversely affecting the equipment of the customer. Isolation amplifier 80 is only bypassed when CMOUT, the voltage between a battery cell and earth ground, is being measured. Measurement of CMOUT requires the creation of a path between input B02 and earth ground through resistor 86a (preferably, a 10K resistor) in order to detect any ground faults within the system of the customer.

In operation, when one of the multiplexers 45, 46 or 47 (FIG. 4) selects a particular battery cell in bank 50, the differential cell voltage is provided by multiplexer 45, 46 or 47 to the analog board 42, and more particularly to the BO1 and B02 inputs of isolation amplifier 80 (FIG. 6B). Isolation amplifier 80 provides a precisely controlled gain together with an extremely low offset voltage which permits very accurate measurement of the cell voltage. Isolation amplifier 80 also provides isolation of the battery bank 50 (FIGS. 3 and 4) from earth ground. Operational amplifiers 82 and 84, which are connected in series to the output of isolation amplifier 80, provide gain and offset adjustment for calibration and high frequency rolloff at 5 kHz, respectively. The differential voltage resulting from the operation of analog board 42 is provided as an output DIFFOUT ADC from operational amplifier 84. Moreover, the latter differential voltage output is then provided, via interfaces 41 and 30 (FIG. 4), to the A/D converter 29, wherein it is converted to digital form, and the resulting digital data are provided via back plane 28 to the CPU 26 of controller unit 20.

The CPU 26 (FIG. 4) provides a control signal CM which functions to select the common mode voltage for measurement. Operational amplifier 86 (FIG. 6B) receives the control signal CM as input CMIN, and generates common mode output control signal CMOUT.

The output CMOUT is the voltage measured between the negative terminal of a particular battery (one of batteries 51–56 of FIG. 3) and earth ground. The negative input BO2 to isolation amplifier 80 is connected to the particular battery in question via multiplexer 45 of FIG. 5, as described above. In a manner to be described in more detail below (with reference to FIG. 7), a control signal is sent by CPU 26 (FIG. 4) to the control and voltage sensor board 43, causing the CMIN input to operational amplifier 86 (FIG. 6B) on analog board 42 to be connected to the BO2 input to isolation amplifier 80.

Continuing with the discussion of the operation of the circuitry of FIGS. 6A and 6B, the circuitry surrounding operational amplifier 86—in particular, voltage divider resistors 86a and 86b—divides the voltage between BO2 (CMIN) and ground by a certain factor (for example, 12), and provides a voltage signal output CMOUT ranging between zero volts and a predetermined value (e.g., +5 volts) which is proportional to the battery voltage measured. The output CMOUT of operational amplifier 86 is then provided as an input to the A/D converter 29 (FIG. 4) and is converted to digital form, the resulting digital data being processed by CPU 26, and then displayed or stored in memory as required. In this manner, the controller 20 of FIG. 4 obtains a measurement of battery cell voltage for a particular battery, as selected by one of the multiplexers 45, 46 or 47.

Further referring to analog board 42 of FIGS. 6A and 6B, differential amplifier 89 receives an input TIN corresponding to the temperature measurement for a particular battery cell selected by the multiplexer 45 of FIG. 5. More specifically, returning to FIG. 3, multiplexer 72 receives temperature measurement data T0–T7 from respective thermistors (not shown) associated with corresponding battery cells within the bank 50 (in FIGS. 3 and 4). Multiplexer 72 selects a particular one of the battery cell temperature measurements for provision, as output TOUT, to the TIN input (the non-1 inverted input) of differential amplifier 89 (FIG. 6). Differential amplifier 89, with its associated fixed resistors 89a and 89b and associated variable resistor 89c, develops an output temperature measurement TOUT which is provided to the A/D converter 29 (FIG. 4). Converter 29 converts the temperature measurement data to digital form, and then provides that digital data to CPU 26 for further processing and storage, as required.

Figure 7:
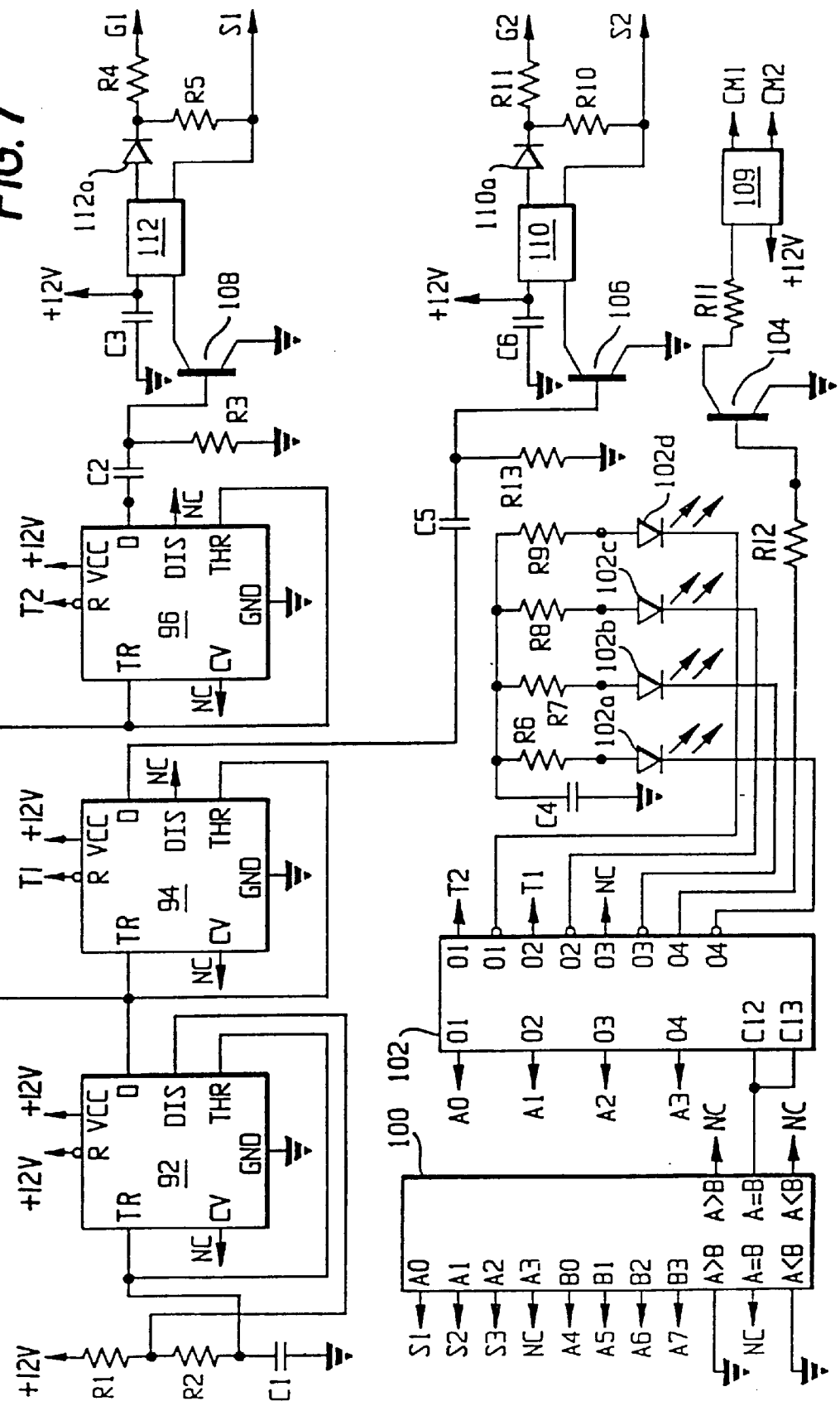
FIG. 7 is a circuit diagram of the control board of the controller of FIG. 4.

FIG. 7 is a circuit diagram of the control board of the battery monitoring system. As seen therein, control board 90 basically comprises high frequency oscillators 92, 94 and 96, DIP switches 98, decoder 100, latch 102, associated LED's 102a–102d, field effect transistor (FET) 104, further transistors 106 and 108, photo MOS relay 109, pulse transformers 110 and 112, associated rectifiers 110a and 112a, and various capacitors, resistors and other elements connected as shown.

Oscillator 92 functions as a high frequency oscillator to switch the input voltage at a sufficiently high frequency to use a small pulse transformer (pulse transformers 110 and 112) as an isolation mechanism between the control board 90 and voltages being measured. If no oscillator or isolation transformer were used, the voltage signals could still be measured, but a fault could occur. In accordance with the present invention, high frequency oscillator 92 is used, and this permits the use of physically small transformers to provide electrical isolation.

Oscillators 94 and 96 are identical in make-up to the oscillator 92, but merely function as drivers for transistors 106 and 108, respectively.

Figure 9:
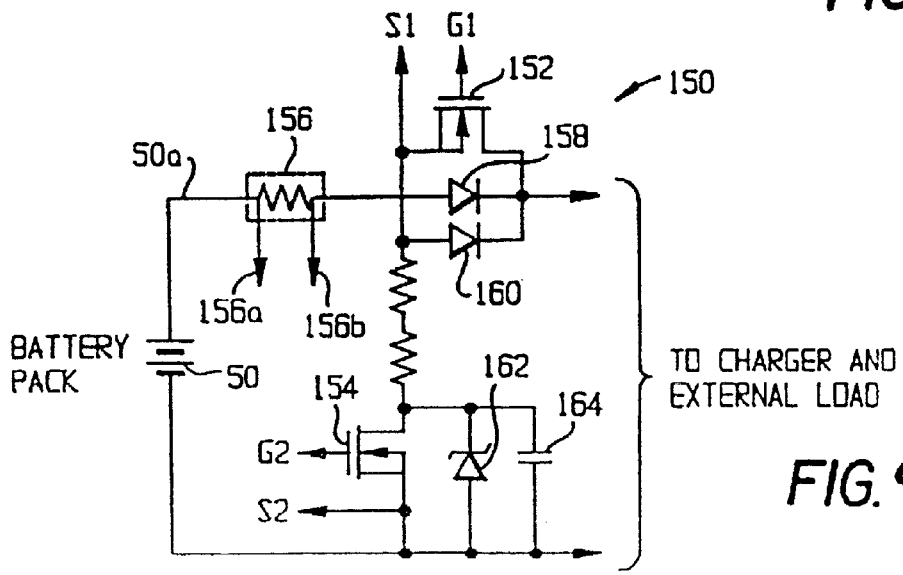
FIG. 9 is a circuit diagram of the load tester and battery isolation circuitry of the controller of FIG. 4.

Rectifiers 110a and 112a are rectifying diodes which, with their associated resistors and the internal capacitance of switching transistors located in the load panel 44 (FIGS. 4 and 9), perform the function of rectifying and filtering the outputs of pulse transformers 110 and 112, thereby permitting proper switching of the switching transistors located on the load panel 44 (FIG. 4), specifically the load tester 150 of FIG. 9.

Photo MOS relay 109 is used to interconnect the BO2 input to isolation amplifier 80 of analog board 42 (FIGS. 6A and 6B) and the CMIN input to operational amplifier 86 of the analog board 42. As mentioned above with respect to the description of analog board 42 of FIGS. 6A and 6B, this interconnection permits measurement of the common mode voltage, which appears as the output CMOUT of operational amplifier 86 of FIG. 6B.

DIP switches 98 are preset to provide a unique address for the particular control board 90 with which it is employed. As previously discussed, the controller 20 (FIGS. 3 and 4) can monitor up to six battery strings, and each battery string requires one multiplexer and load unit (such as unit 40 of FIG. 4). Thus, there can be up to six control boards associated with a given controller, and this makes it necessary that each control board 90 be uniquely identifiable by the CPU 26 (FIG. 4). DIP switches 98 serve this function.

Decoder 100 functions to identify address information provided thereto, such address information corresponding to the address or identity of a particular control board. If decoder 100 of control board 90 of FIG. 7 determines that the address information corresponds to the identity of the particular control board 90, decoder 100 activates latch 102. Depending on the particular address information, latch 102 turns on oscillator 94, oscillator 96 or FET 104, and this causes a transistor 154 in load tester 150 (FIG. 9) to be turned on so as to initiate a load test or battery bank charging, or to turn on photo MOS relay 109 so as to initiate common mode voltage measurement via CMOUT of operational amplifier 86 in analog board 42 (FIGS. 6A and 6B). The load testing and battery bank charging functions will be discussed in more detail with reference to FIG. 9.

LED's 102a–102d are turned on as a result of the operation of latch 102, and indicate which of the address lines and associated control functions are being activated by the latch 102.

Preferably, pulse transformers 110 and 112 are 1:1 pulse transformers. As previously indicated, transformers 110 and 112 provide isolation between control board 90 and MOS-FET transistor 154 in the load tester 150 of FIG. 9.

Figure 8:
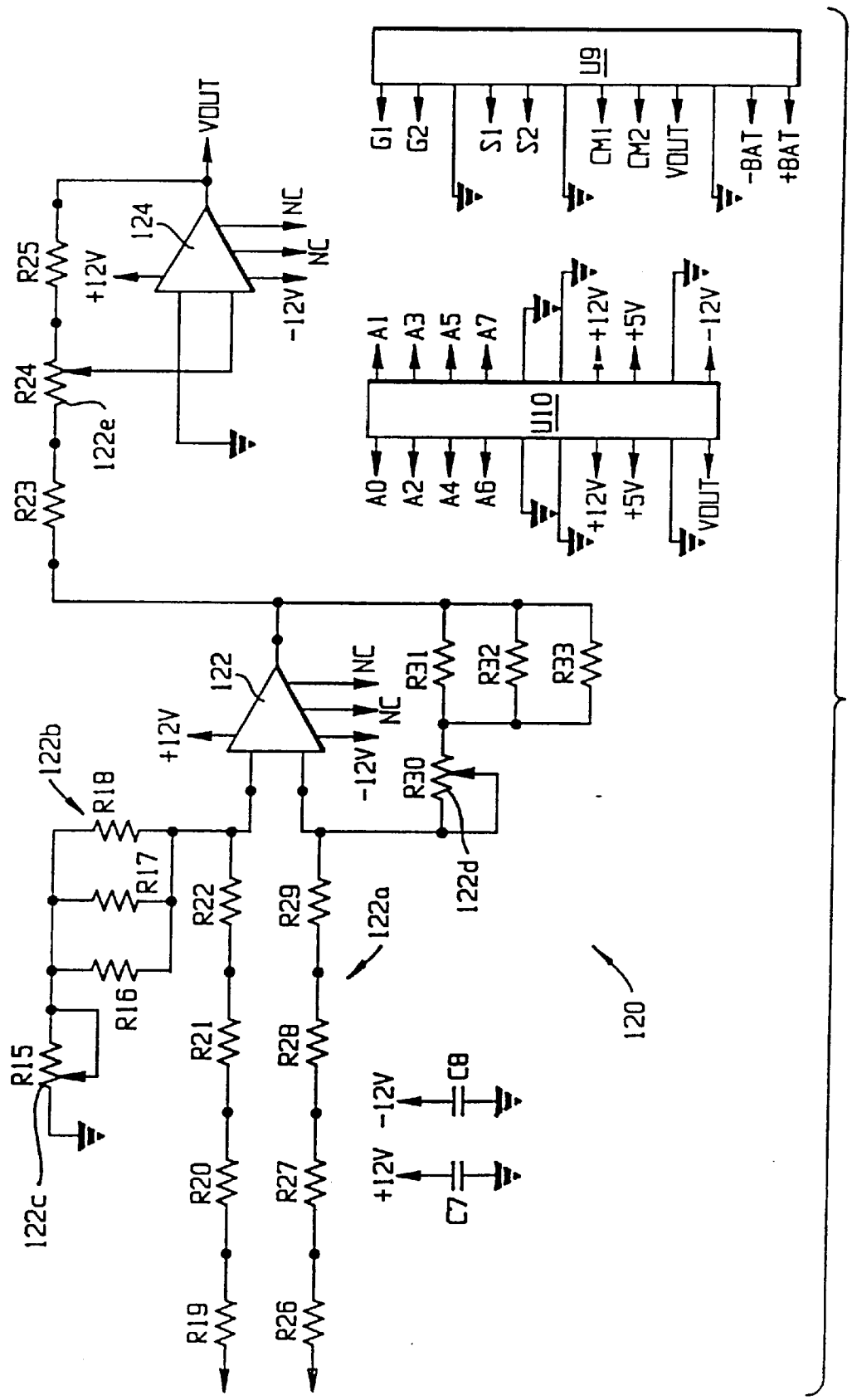
FIG. 8 is a circuit diagram of the voltage sensor circuitry of the controller of FIG. 4.

FIG. 8 is a circuit diagram of the voltage sensor circuitry of the battery monitoring system. As seen therein, voltage sensor circuitry 120 basically comprises operational amplifiers 122 and 124 with the various resistors (both fixed and variable) connected as shown.

Voltage sensor circuitry 120 of FIG. 8 is utilized to measure pack voltage, as opposed to individual battery cell voltage. Inputs +BAT and −BAT are hard-wire connected to the positive and negative sides (that is, terminals 50a and 50b) of the battery pack 50 shown with the load tester 150 in FIG. 9. A network of series-connected resistors 122a and a plurality of parallel-connected resistors 122b are provided at the input side of operational amplifier 122, a plurality of series-connected resistors being provided between each of the +BAT and −BAT inputs and the inverted and non-inverted inputs, respectively, of operational amplifier 122.

The arrangement 122a and 122b of series-connected and parallel-connected resistors (preferably, resistors having a resistance of 250K ohms) comprises a divide-by-12 circuit which is accurately temperature-compensated. It should be noted that, whereas a 1 M ohm resistor could have been used in place of four 250K ohm resistors in series, a 1 M ohm resistor will have a different thermal characteristic than a 250 K ohm resistor. In accordance with the invention, by using only 250K ohm resistors, the circuit output is stable as temperature changes, since identical resistors have identical thermal characteristics.

Further referring to FIG. 8, variable resistors 122c and 122d are used to zero operational amplifier 122, the divide-by-12 circuitry 122a, 122b, and further variable resistor 122e together with operational amplifier 124 and its associated circuitry. This "zero" technique is used to compensate for any tolerances associated with operational amplifier 122 and to adjust the gain exactly to a value appropriate to the voltage rating of the system being monitored (for example, to a value of $\frac{1}{12}$ for a 48-volt system). The output VOUT of operational amplifier 124 is then sent to the A/D converter 29 (FIG. 4) for digital conversion and subsequent processing by and storage in CPU 26. In this manner, the measurement of pack voltage is achieved by the system 10.

FIG. 9 is a circuit diagram of the load tester and battery isolation circuitry of the battery monitoring system. As seen therein, load tester 150 basically comprises FET's 152 and 154, shunt 156, Schotkey diodes 158 and 160, Zener diode 162, capacitor 164 and resistors 166 and 168.

The gate and source inputs G1, S1 and G2, S2 to FET's 152 and 154, respectively, are provided by the control board 90 of FIG. 7, and specifically are the outputs of pulse transformers 112 and 110, respectively. As is well-known in the operation of such FET's, when the gate G1 or G2 closes, the source S1 or S2 is connected to the drain (not shown) of FET's 152 and 154, respectively.

In operation, FET 152 controls the charging of the battery pack 50. That is to say, when FET 152 is in the "open" state, the battery pack 50 is not charged; when FET 152 is in the "closed" state, the battery pack 50 is charged. Diodes 158 and 160 prevent charging of battery pack 50 when FET 152 is in the "open" state, while allowing the battery pack 50 to supply load if required. Resistors 166 and 168 are load resistors, and load the battery pack 50 during load testing.

When FET 154 is in the "open" state, loading of the battery pack 50 is prevented; when FET 154 is in the "closed" state, a load is applied across the terminals of battery pack 50. Zener diode 162 and capacitor 164 are provided for surge protection of the FET 154.

Further referring to FIG. 9, shunt 156 allows for measurement of voltage and current flow to and from battery pack 50 during load testing and charging. Connections 156a and 156b on opposite sides of the shunt 156 are connected to a channel of multiplexer 48 (FIG. 4). Multiplexer 48 is designated a "miscellaneous multiplexer" in that it differs from multiplexers 45–47.

More specifically, as previously explained, each of multiplexers 45, 46 and 47 serves a different bank of batteries (each containing up to eight battery cells). Multiplexer 48 is provided as a "miscellaneous multiplexer" to allow measurement of voltage not across a battery cell, but across the shunt 156. Such a measurement is representative of the current passing through the shunt 156 during either the charge or discharge stages of the battery pack 50.

Returning to FIG. 5, DIP switches 75 are set to identify multiplexer 48. Two of the inputs of multiplexer 48 (for example, the BO2 input of relay 76b and the BO1 input of relay 76c) are shorted together to allow for measurement of a known voltage (zero volts, since the inputs are tied together), thereby allowing for system self-nulling and automatic offset adjustments. If a voltage other than zero is measured across the two shorted inputs, then the voltage is subtracted from other measured voltages to provide automatic offset adjustment and ensure system accuracy.

Figure 10A:
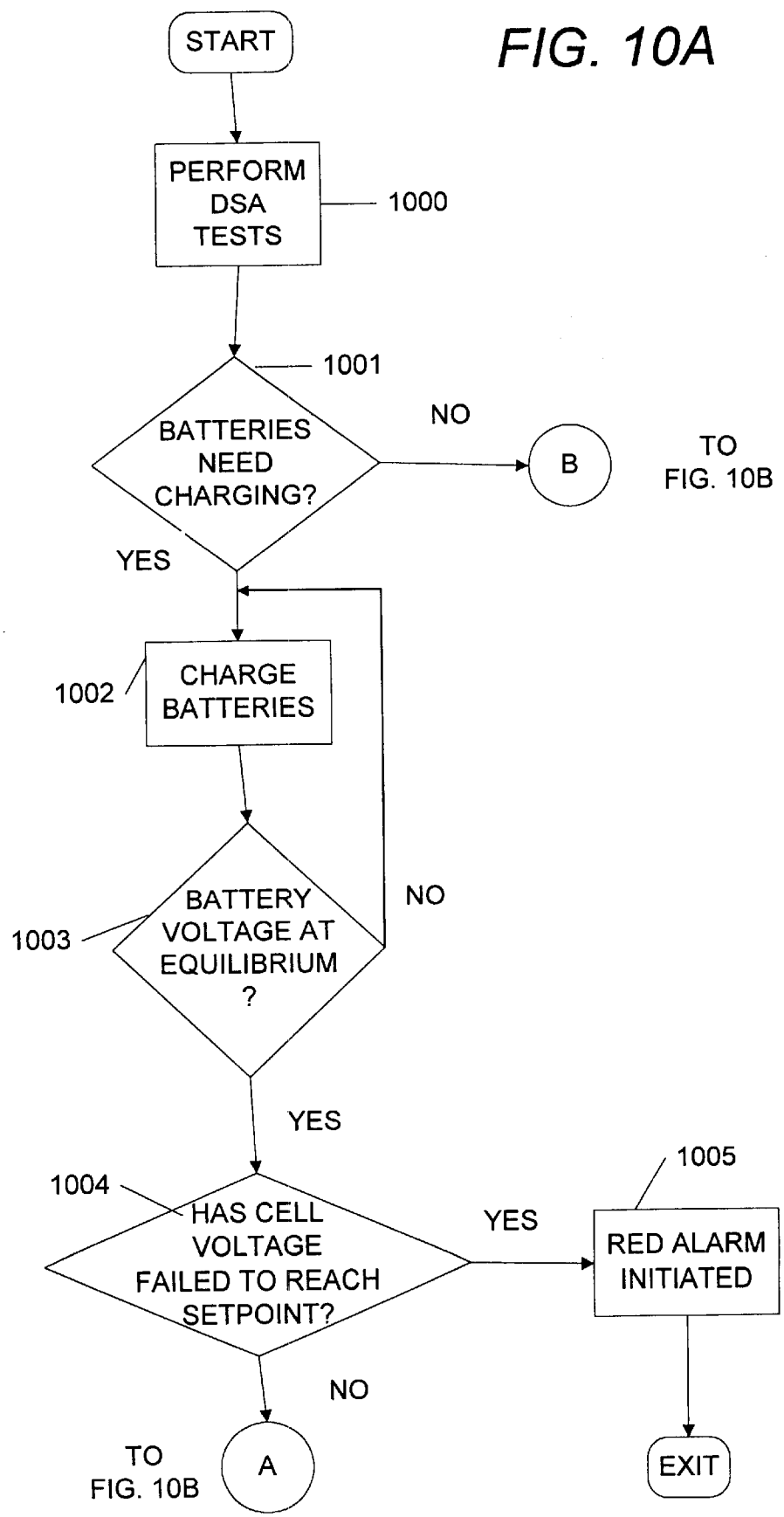
FIGS. 10A and 10B are a flowchart of the controller start-up sequence in accordance with the present invention.
Figure 10B:
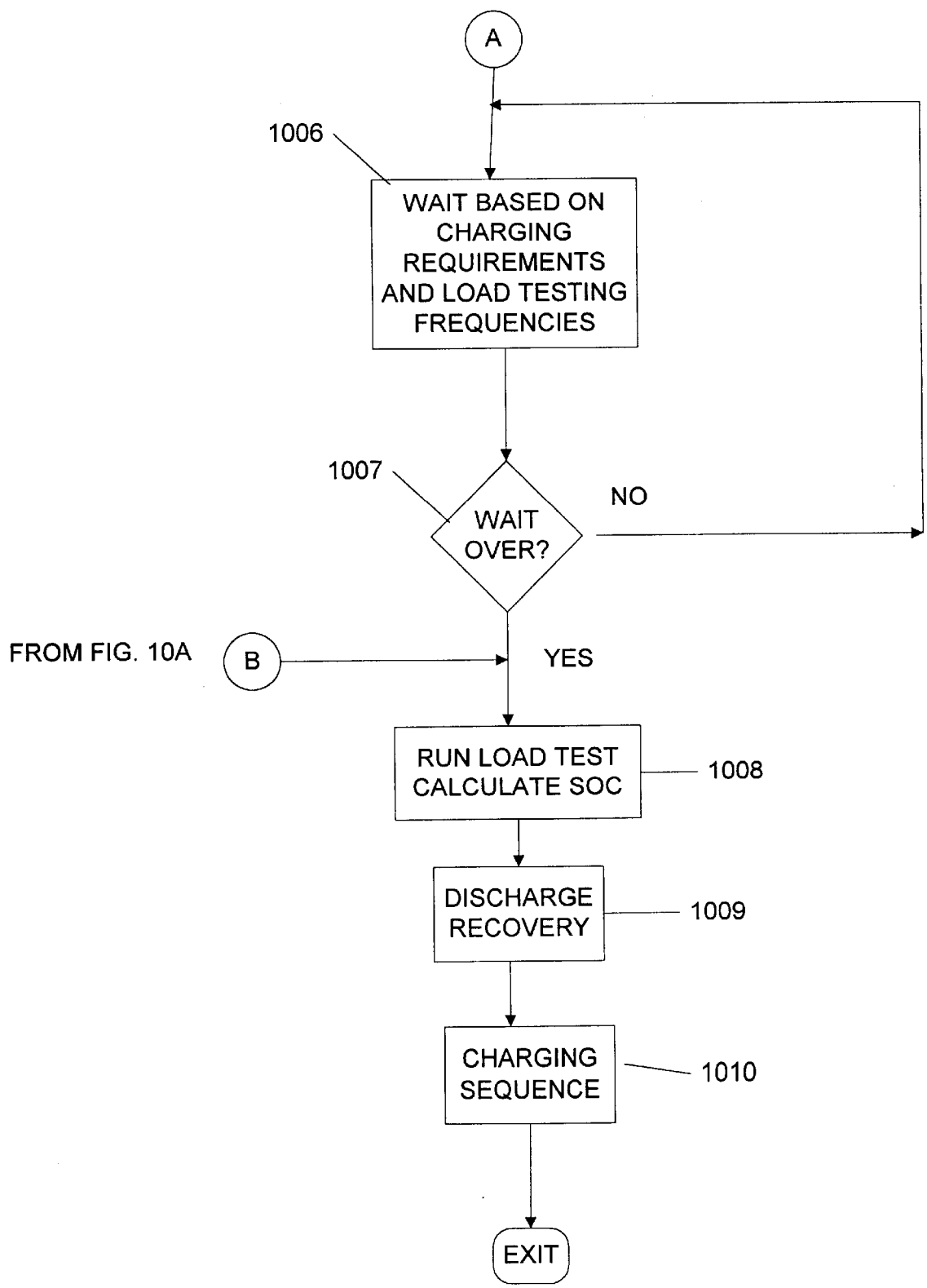

FIGS. 10A and 10B are a flowchart of the controller start-up sequence in accordance with the present invention. Specifically, whenever a controller 10, 12 or 14 is turned on or receives power, it performs a start-up sequence as follows.

Down scale alarm (DSA) tests are performed (block 1000). A determination is made as to whether the batteries need charging (block 1001). If not, a branch to block 1008 is executed.

If the batteries do need charging, the batteries are charged (block 1002), and a determination is made as to whether equilibrium has been reached (block 1003). Battery voltage is at equilibrium when battery voltage reaches nominal levels and current drops to a minimal value.

If equilibrium has not been reached, charging of the batteries continues (block 1002). On the other hand, if equilibrium has been reached, a determination is made as to whether cell voltage has failed to reach the set point (block 1004). If cell voltage has failed to reach set point, a red alarm is initiated (block 1005), and the start-up sequence is ended. If cell voltage has not failed to reach set point, a "wait state" is entered based on the charging requirements and load testing frequencies established for the system (block 1006). That is to say, the batteries are permitted to recover from charging by waiting for a period of time (e.g., twenty-four hours), and the period of waiting time is defined as the "charge recovery cycle."

A determination is made as to whether the waiting period is over (block 1007) and, once the waiting period is over, a load test is run (block 1008). A discharge recovery cycle is then initiated (block 1009) and, once that cycle is completed, a charging sequence is initiated (block 1010). Upon completion of the charging sequence, the start-up sequence for the controller 10, 12 or 14 is completed.

As previously mentioned above, the on-line battery management and monitoring system of the present invention is monitored and controlled through the CMS 2 of FIG. 1. Each controller 10, 12 and 14 automatically cycles through the previously mentioned modes of operation as it manages and monitors its emergency battery system. Those modes of operation are: charge, charge recovery, wait, load test, discharge recovery, and active load.

During the charge mode, the batteries of a particular controller 10, 12 or 14 are connected in parallel with a rectifier/charger (FIG. 3) to charge the batteries. The time required for charging depends upon the type of battery and the SOC thereof. The charge mode corresponds to block 1002 of FIG. 10A.

In the charge recovery mode, the battery voltage approaches equilibrium. This corresponds to the determination made in block 1003 of FIG. 10A.

The wait mode—the period between charging and initiation of load tests—relates to a waiting period which will vary during normal operation depending on the charging requirements and the load testing frequencies. This has been described above with reference to blocks 1006 and 1007 of FIG. 10B.

In the load test mode, the battery management and monitoring system 1 conducts a load test of the batteries by placing a passive resistive load in parallel with the batteries (see FIG. 3). This mode has been described above with reference to block 1008 of FIG. 10B.

Finally, the discharge recovery period amounts to a period of given length (e.g., one hour), during which battery voltage increases toward equilibrium. This has been described with reference to block 1009 of FIG. 10B. The discharge recovery period is followed immediately by a charging sequence (described above with reference to block 1010 of FIG. 10B) to ensure that the battery voltage and capacity are within acceptable parameters.

It should be evident from the above that an extremely critical feature of the battery management and monitoring system 1 of FIG. 1 resides in the central monitoring system (CMS) 2 thereof. The CMS 2 is software-controlled. Moreover, as a result of the control of its operations, the CMS 2 generates various unique and inventive displays of data, and the latter unique feature provides significant advantages to the individuals who operate the battery management and monitoring system.

FIGS. 11A–11G are a flowchart of the software-controlled operations performed by the controller of FIG. 4; FIGS. 12A–12Z are illustrations of the various displays appearing on the display unit of a controller during operation thereof in accordance with the present invention. The software operation and unique data display carried out by the CMS 2 of FIG. 1 will now be described with reference to the latter figures.

Figure 11A:
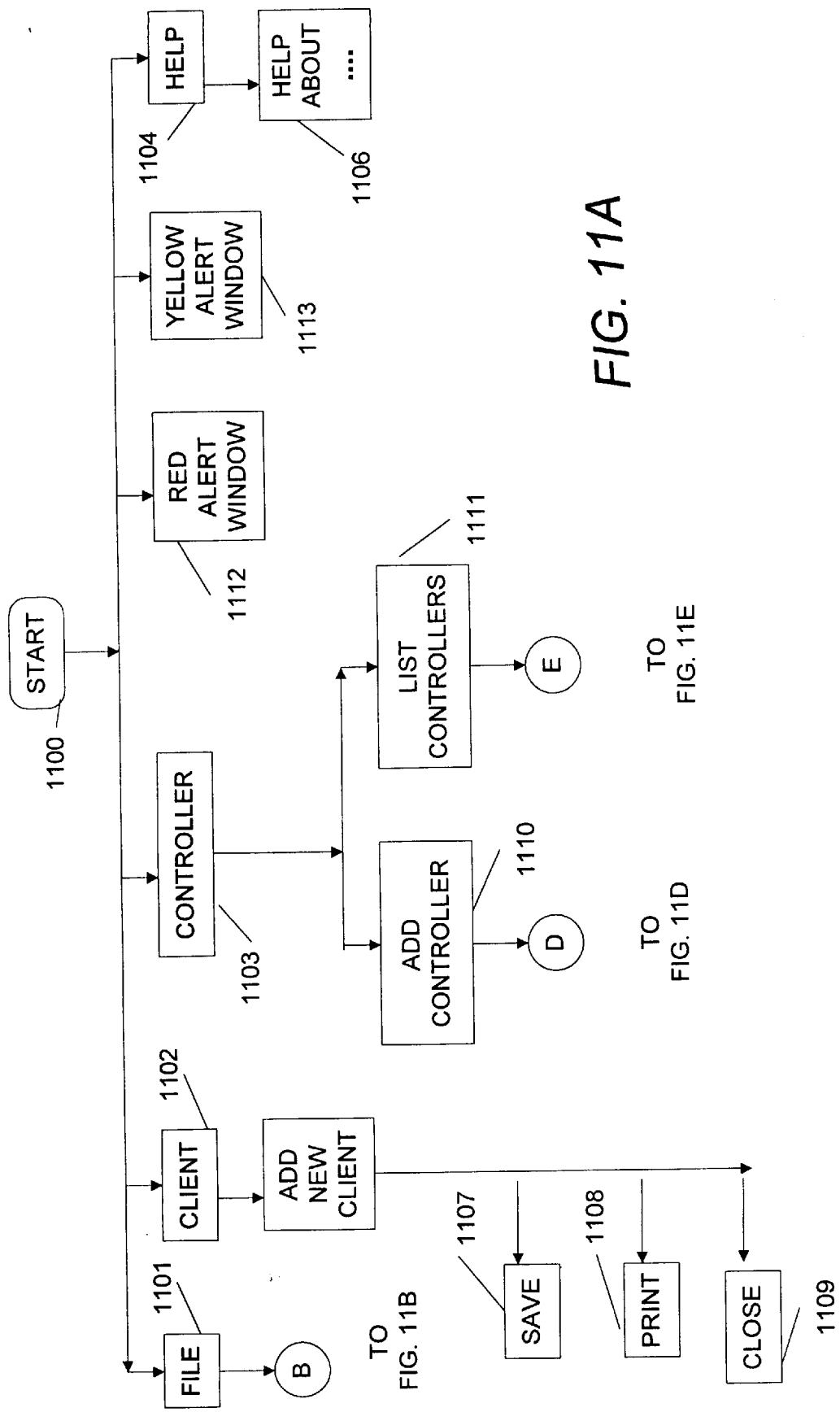
FIGS. 11A–11G are a flowchart of the software-controlled operations performed by the controller of FIG. 4.
Figure 12A:
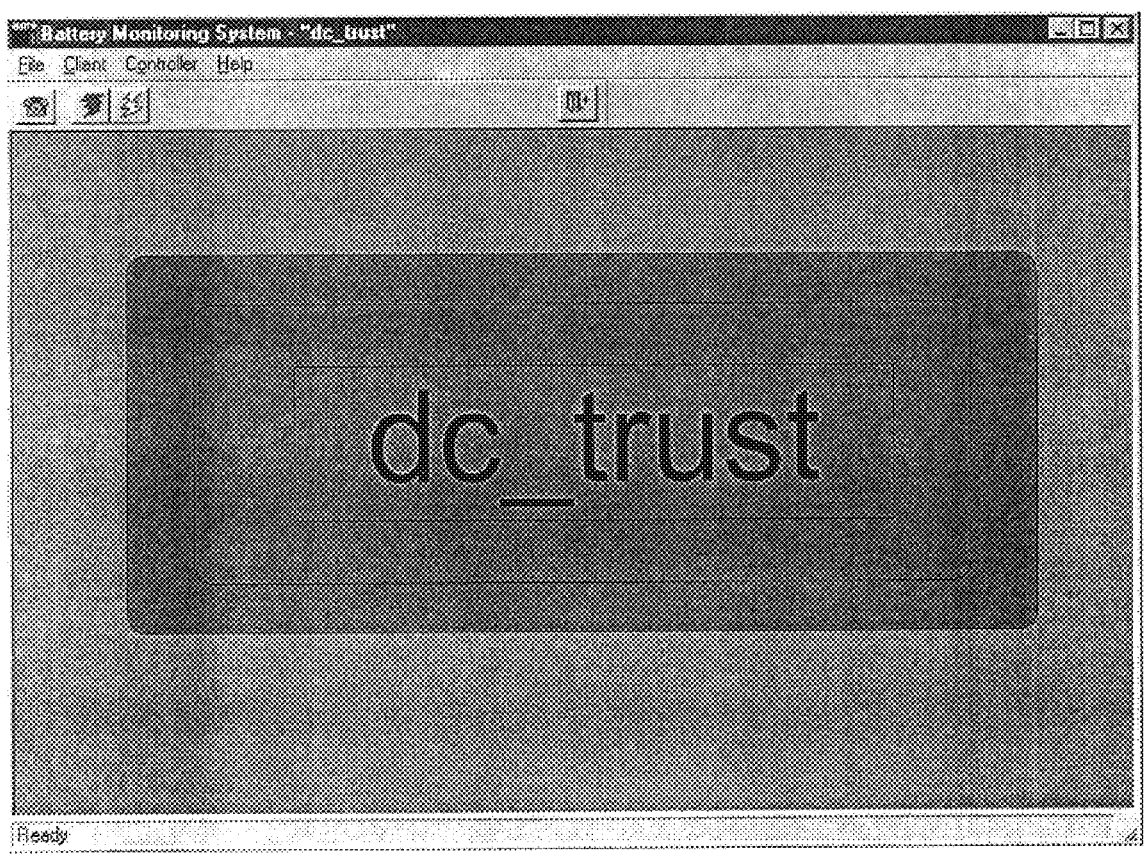
FIGS. 12A–12Z are illustrations of the various displays appearing on the display unit of a controller during operation thereof in accordance with the present invention.

Referring to FIGS. 11A and 12A, start-up of the CMS 2 of FIG. 1 results in display of an initial menu from which the user selects FILE (block 1101), CLIENT (block 1102), CONTROLLER (block 1103), or HELP (block 1104).

Figure 11B:
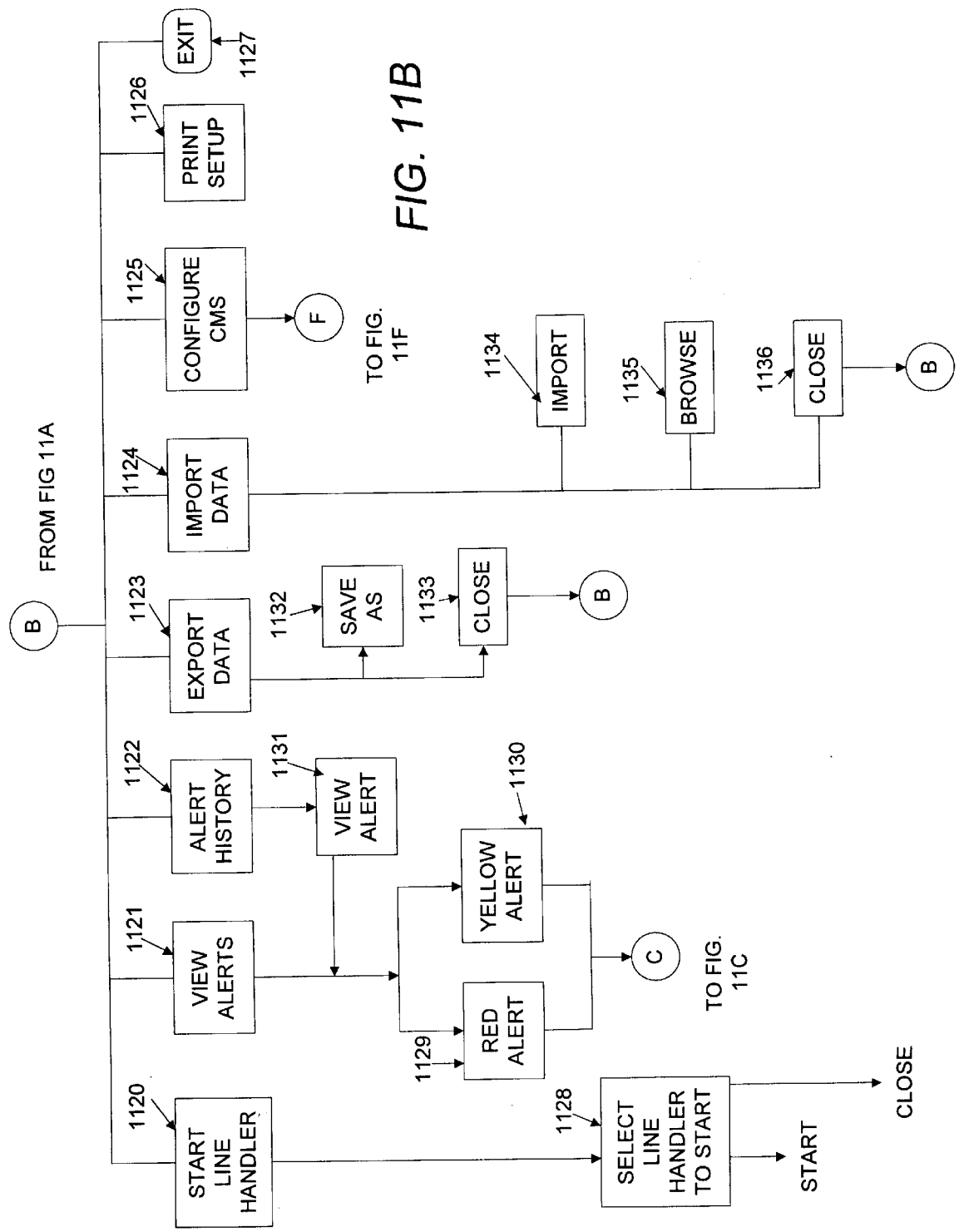
Figure 12B:
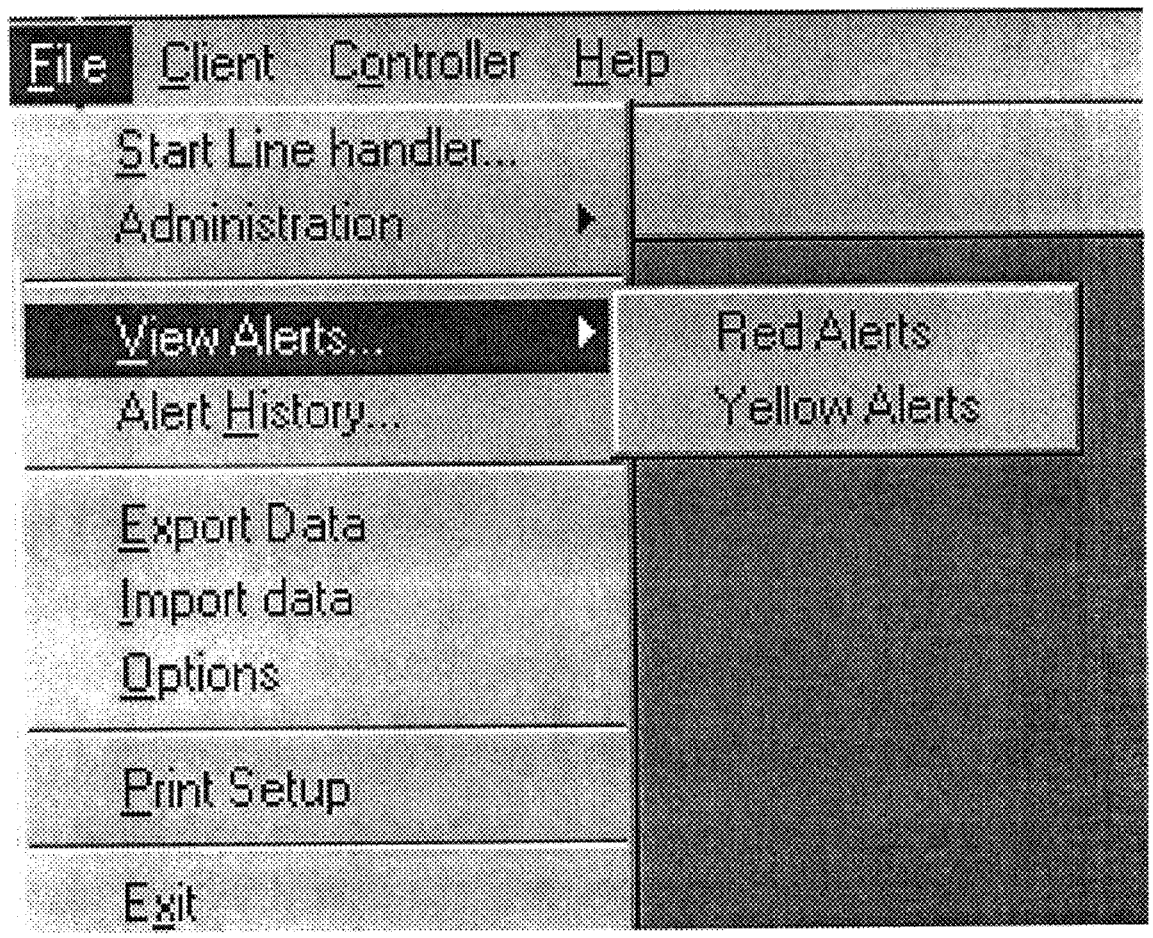

If the operator selects FILE, a plurality of other options (FIG. 11B, blocks 1120–1127) are presented, and these are displayed in the manner indicated in FIG. 12B. Specifically, the following options are presented: start line handler, view alerts, alert history, export data, import data, configure CMS, print setup, and exit (FIG. 11B, blocks 1120–1127).

The "start line handler" option (block 1120) initializes a line on which a remote controller can contact the CMS. Up to n line handlers may be entered, where n is a parameter in the initialization file (e.g., dc_trust.ini file). For every line handler, there must be a port and a respective device defined in the initialization file. There can be as many line handlers in a system as there are devices to support them. Each line handler must have its own device to wait upon, and each line handler must have its own sub-directory to operate in. Thus, if the main directory is c:\dctrust\, then line handler 1 would use working directory c:\dctrust\line1\, line handler 2 would use working directory c:\dctrust\line2\ and so forth. Line handlers create log files with the name logfileXX.txt, where XX goes from 1 to 10. The log files contain information about the last ten sessions for any line handler. Each line handler can create all of the log files. This is very important if communications problems are indicated. As a minimum, one line handler must be initialized to receive incoming calls.

Figure 12C:
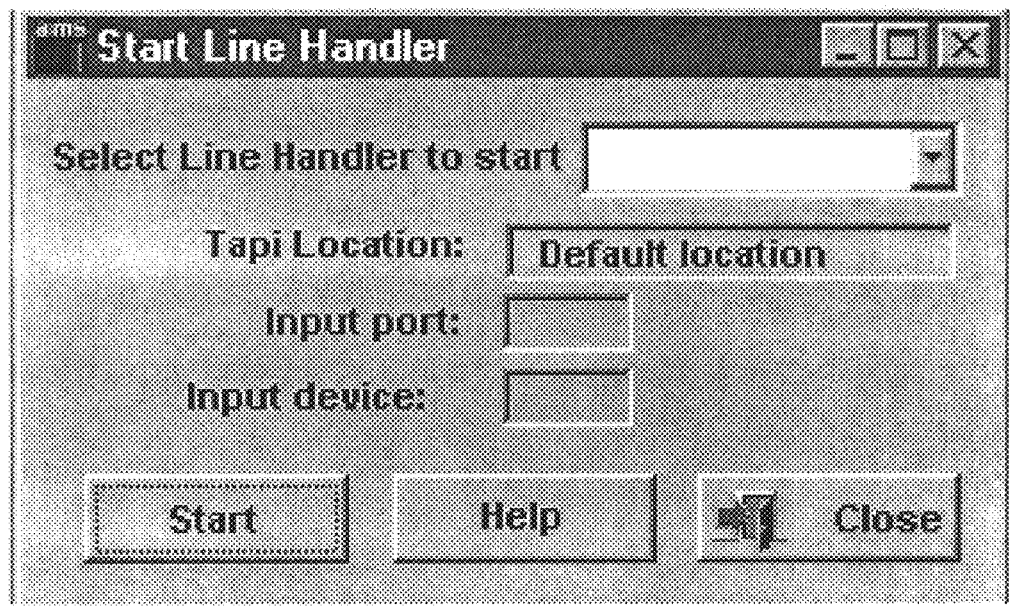

Thus, in operation, the user selects "start line handler" (FIG. 12B), and the system displays the "start line handler" selection box (FIG. 12C). The user selects the line handler to start (FIG. 11B, block 1128 and FIG. 12C). The input port and device information will be filled in automatically (FIG. 12C), and the user will then start the line handler by selecting "start", and will then close the window by selecting "close".

Returning to FIG. 11B, the user can select the option "view alerts" (block 1121), and then can select either red alerts or yellow alerts (FIG. 11B, blocks 1129 and 1130; see also FIG. 12B).

Figure 11C:
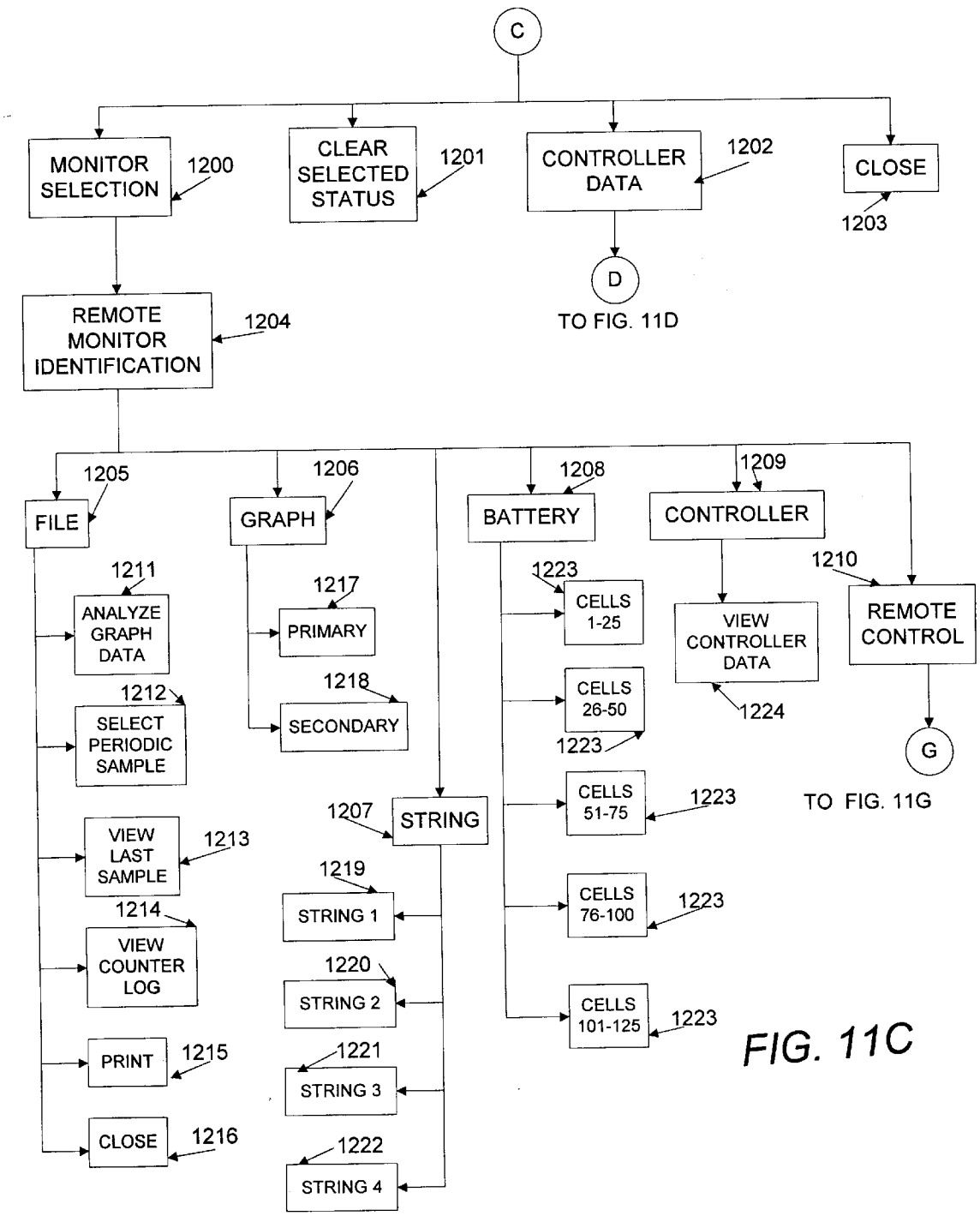
Figure 12D:
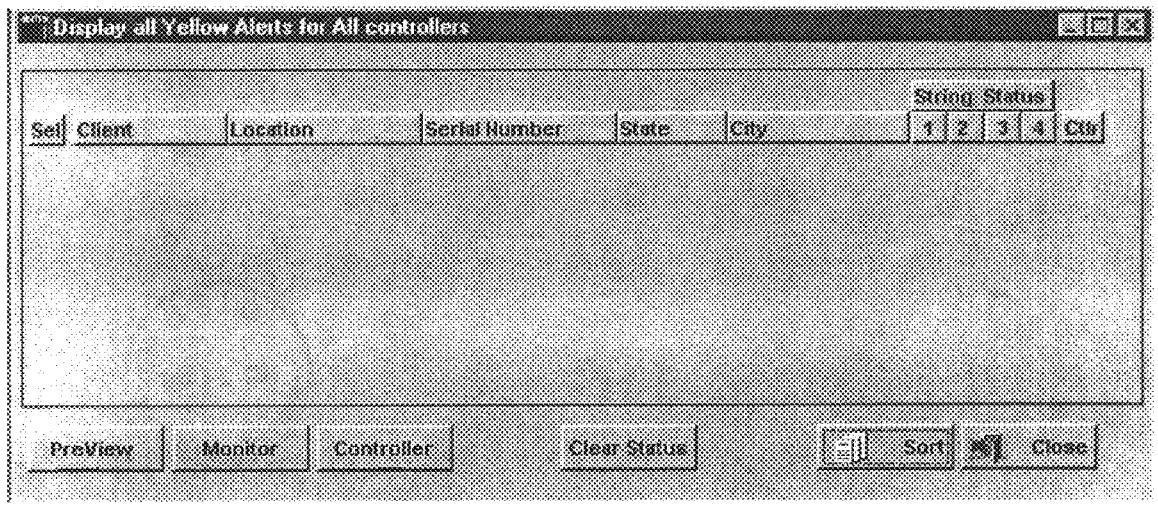

Upon selecting the particular type of alerts to be displayed, the system displays all alerts of that type for all controllers in the manner shown in FIG. 12D. At this point, the user can select from among four options, shown in FIG. 11C and discussed below.

Returning to FIG. 11B, the user can select alert history (block 1122). This option provides a chronological history of all alerts received by the CMS, as shown in FIG. 12R. Only one historical alert may be flagged for viewing at any given time. As indicated in FIG. 12R, the user can select "view alert" or "controller data" as further options, or can close the window by selecting "close". If "view alert" is selected, the process as described above relative to block 1121 of FIG. 11B takes place, proceeding in the manner suggested in FIG. 11C, which will be discussed below. If "controller data" is selected, then the window for viewing or updating controller data for a client or controller location, as shown in FIG. 12M, is displayed. This will be discussed in more detail below within the context of an overall discussion of FIG. 11C.

Returning to FIG. 11B, the option "export data" (block 1123) permits the user to save specific samples to another location in the computer in which the CMS is installed, or to another computer entirely. These samples can then be deleted from the active data base. Upon selection of "export data" the system displays a window for selecting samples to export, as shown in FIG. 12S. Once a particular sample is selected for export, the user can select "Save as" in order to save the sample at another location in the computer in which the CMS is installed, or in another computer (see FIG. 11B, block 1132). Once the selection operations of this window have been performed, the user selects "close" to close the window (FIG. 11B, block 1133).

Returning to FIG. 11B, the user can select "import data" (block 1124), in order to import data into the CMS. As a result of this selection, the CMS displays a window (FIG. 12T) for importing data. An import file name can be entered or selected during execution of the "browse" option, the data can be imported by selecting "import", and then the window can be closed by selecting "close" (see FIG. 11B, blocks 1134–1136).

Further referring to FIG. 11B, the user has the option of selecting "configure CMS" (block 1125) in order to configure or reconfigure the CMS. The display presented upon selection of the "configure CMS" option—which is a three-tab display—is shown in FIG. 12U(1). As will be explained below with reference to FIG. 11F, this option is divided into three sections: communications, user defaults, and miscellaneous. All three sections must have data entered prior to set up of the CMS. After all configuration data are entered, the user saves the data and closes the window.

Finally, referring to FIG. 12B, the remaining two options are the "print set up" option and the "exit" option, each of which is self-explanatory. These are the last two options which may be selected from the "file" menu (see FIG. 11B, blocks 1126 and 1127).

Further referring to FIG. 11B, as mentioned previously, if the user selects the option of viewing alerts (blocks 1121, 1129 and 1130), the display shown in FIG. 12D appears. At that point, referring to FIGS. 11C and 12D, the user has four options: monitor selection, clear selected status, controller data, and close (FIG. 11C, blocks 1200–1203).

Figure 12E:
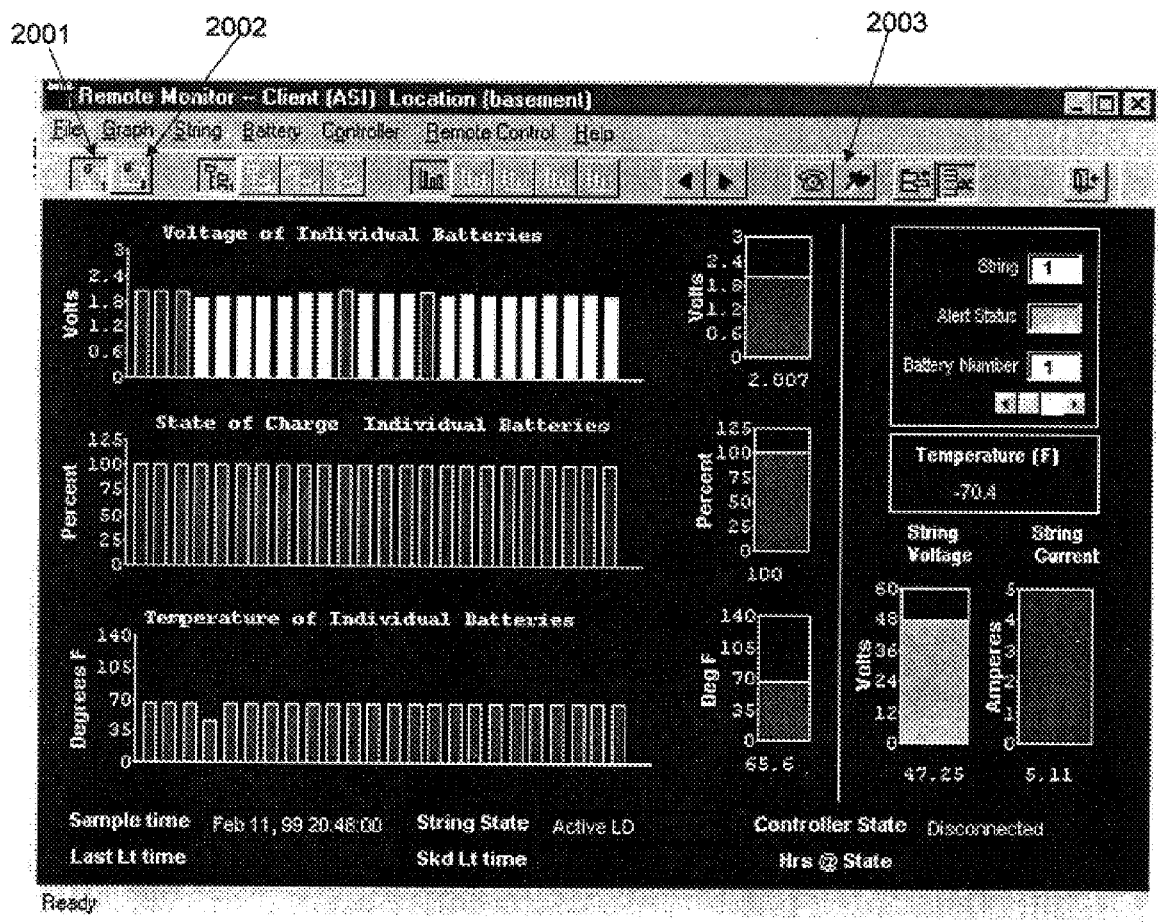
Figure 12K:
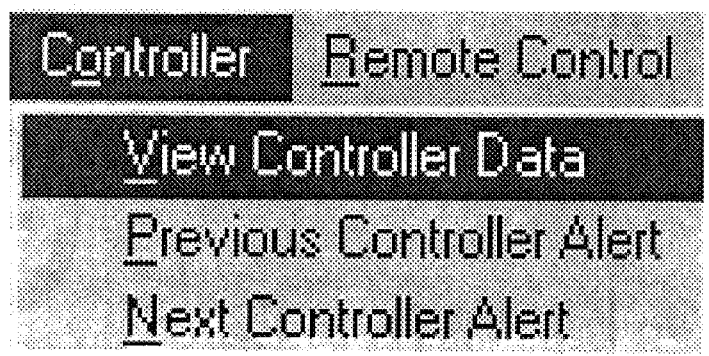
Figure 12F:
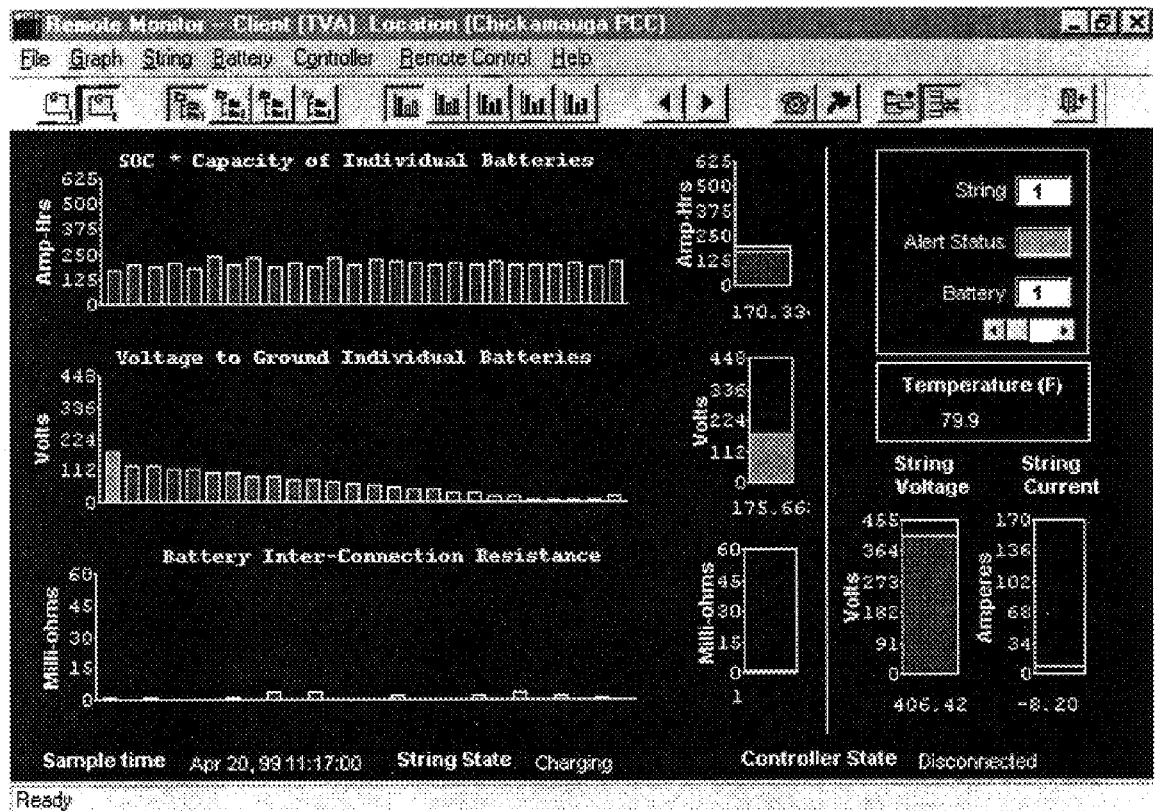

If the user selects "monitor selection" (block 1200), a display as shown in FIG. 12E appears and the remote monitor is identified (FIG. 11C, block 1204). That is, if selection is from the "alert" screen, the identification of the controller is automatic; if the selection is made from the "controller selection" screen, the operator identifies the remote monitor. As seen in FIG. 12E, the user is presented with a display of the voltage, SOC and temperature of individual batteries, as well as various other additional information regarding sample time, string state, controller state, string identity, string status, battery number, string voltage and string current.

In addition, as shown in FIG. 12E, the user is presented with various options: file, graph, string, battery, controller and remote control (FIG. 11C, blocks 1205–1210). In addition, various buttons or icons are provided on the display of FIG. 12E (below the list of options (file, graph, etc.)). For example, the button or icon 2001, when actuated by the user, causes display of the primary graphs and data shown in FIG. 12E. Actuation of the button or icon 2002 results in an alternative or secondary display (shown in FIG. 12F) of available capacity and voltage to ground of the individual batteries, as well as battery inter-connection resistance, sample time, string state, controller state, string number, string status, battery number, temperature, string voltage and string current.

Figure 12G:
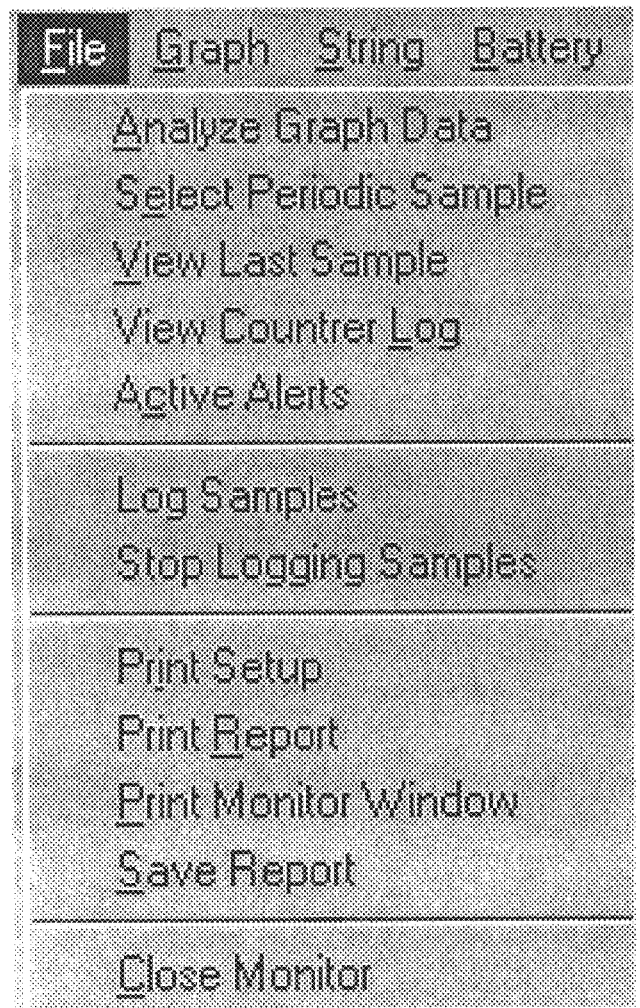

Further referring to FIGS. 11C and 12E, if the user selects the file option (FIG. 11C, block 1205), the display shown in FIG. 12G appears. At that point, the user is presented with additional options: analyze graph data, select periodic sample, view last sample, view counter log, print, and close (FIG. 11C, blocks 1211–1216).

Selection of "analyze graph data" (block 1211) results in a display of graph data in tabular form by cell number. The user may view all data, all red and yellow alerts, only red alerts, or only yellow alerts. The data can be saved in this form to another file or to another computer.

Selection of the "select periodic sample" option (block 1212) results in a listing of all of the samples for the selected controller as stored in the CMS. Selecting a sample, and then clicking on "view last sample" (FIG. 11C, block 1213 and FIG. 12G) populates the monitor graphs of FIGS. 12E and 12F with data from the selected sample. This sample can then be analyzed via the previously discussed "analyze graph data" option (FIG. 11C, block 1211).

As indicated in FIG. 11C, the operator can select "view counter log" (block 1214). Selection of this option results in the display of counter values accumulated by controllers 10, 12 or 14 and sent to the CMS2 (FIG. 1).

Finally, the "print" and "close" options (FIG. 11C, blocks 1215-1216) are self-explanatory.

Figure 12H:
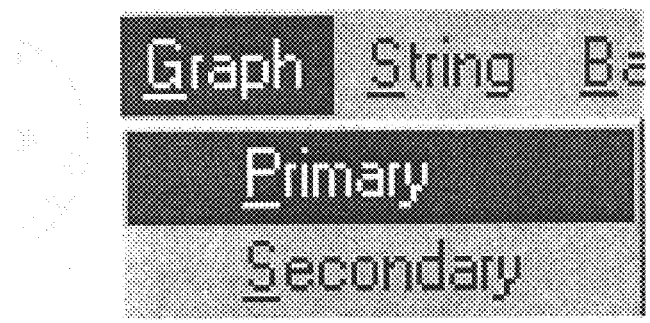

Referring to FIG. 11C, if the user selects the "graph" option (block 1206), the display of FIG. 12H appears. The user is given the choice of a primary graph (block 1217) or a secondary graph (block 1218). Selection of "primary graph" results in a display as shown in FIG. 12E, whereas selection of "secondary graph" results in a display as shown in FIG. 12F.

Figure 12I:
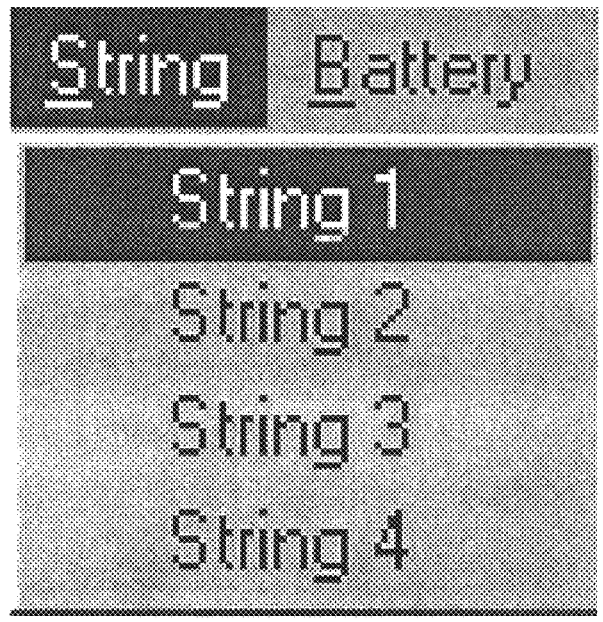

Further referring to FIG. 11C, if the user selects the "string" option (block 1207), a display as shown in FIG. 12I appears, and the user is given the opportunity to select a particular string from, for example, strings 1–4 (FIG. 11C, blocks 1219–1222).

Figure 12J:
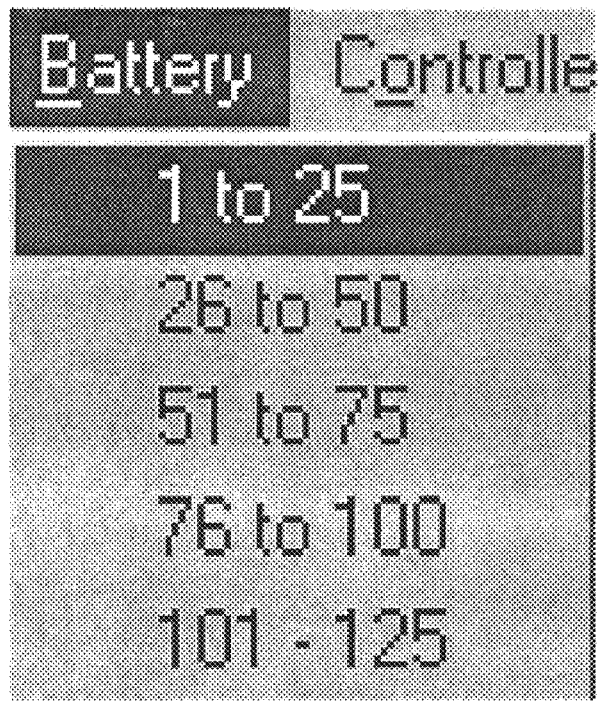

If the user selects the "battery" option (FIG. 11C, block 1208), the user is given the opportunity to select from among various groups of batteries (for example, batteries 1–25, 26–50, 51–75, and so forth—FIG. 11C, block 1223 and FIG. 12J).

If the user selects the "controller" option (FIG. 11C, block 1209), a display as shown in FIG. 12K appears. At this point, the user is given the opportunity to view controller data (FIG. 11C, block 1224).

Figure 12L:
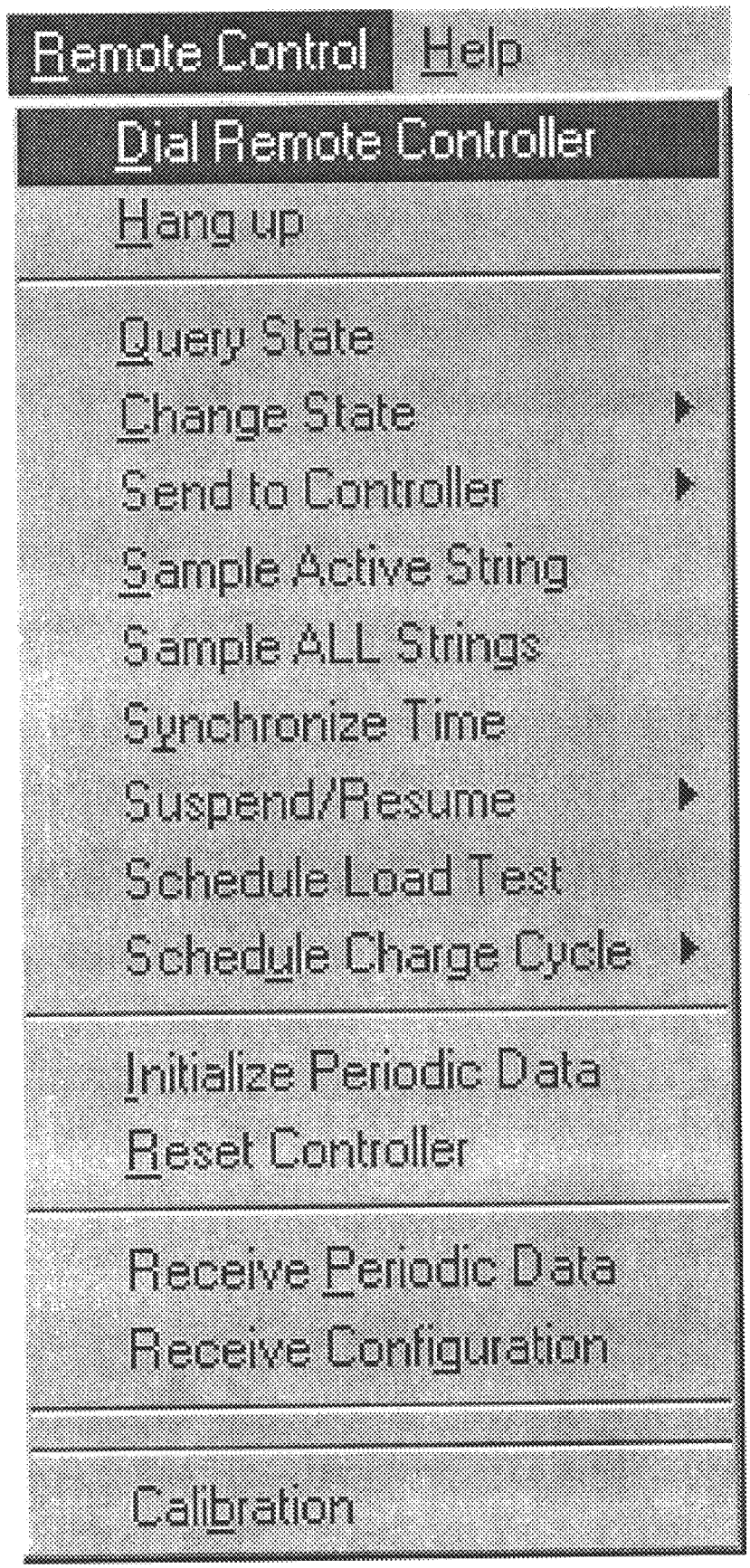
Figures 12M, 12N:
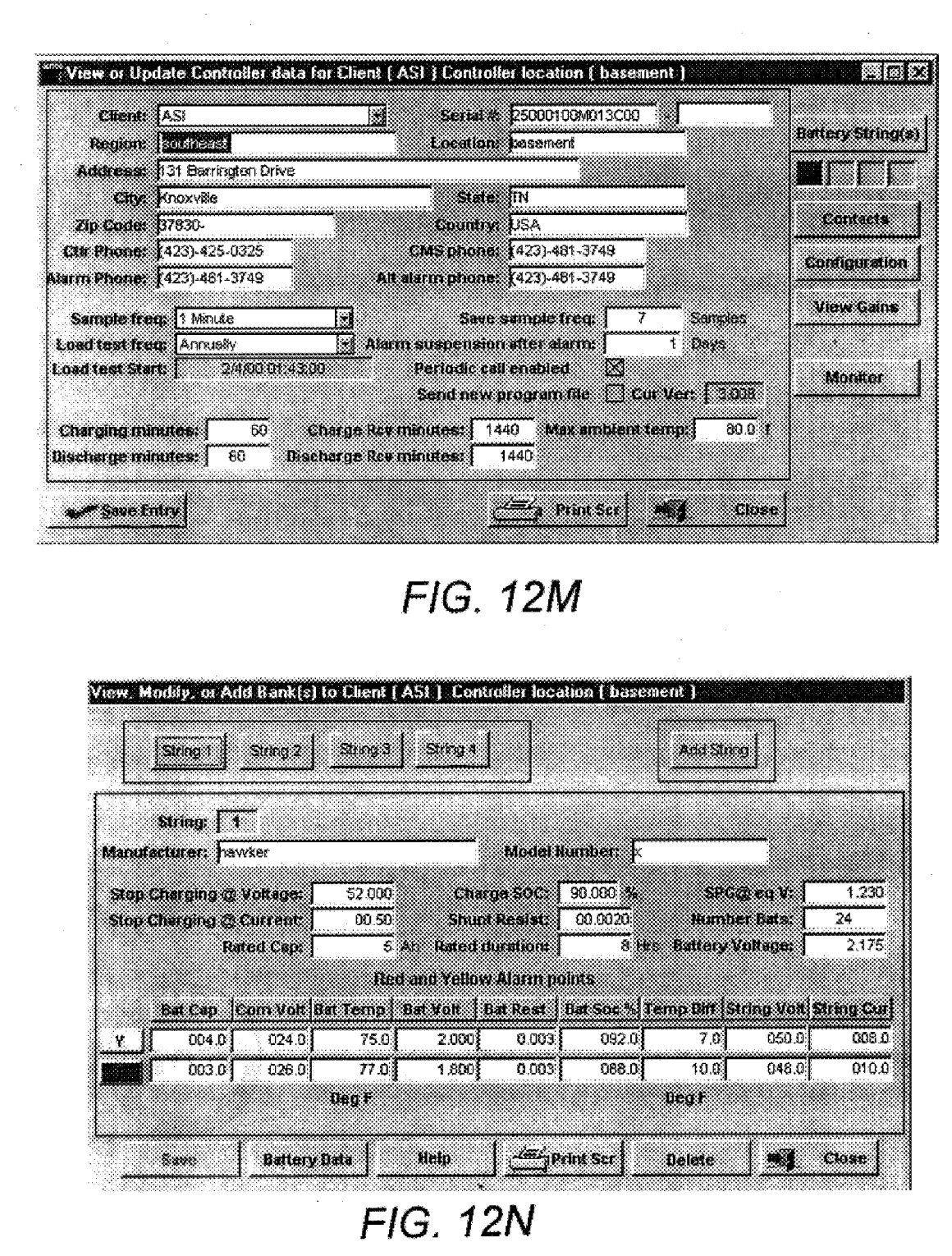
Figures 12O, 12P:
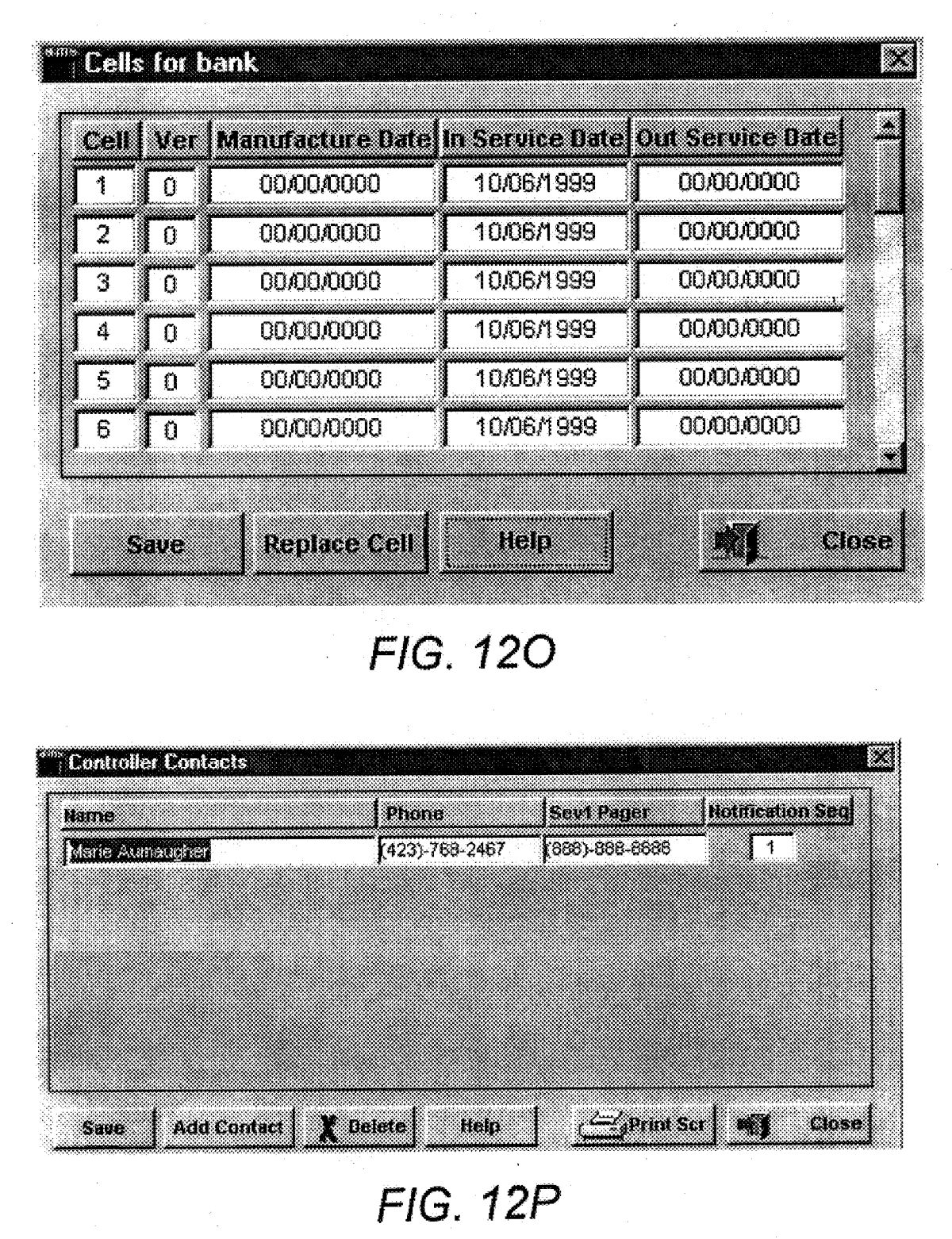
Figures 12Q, 12R:
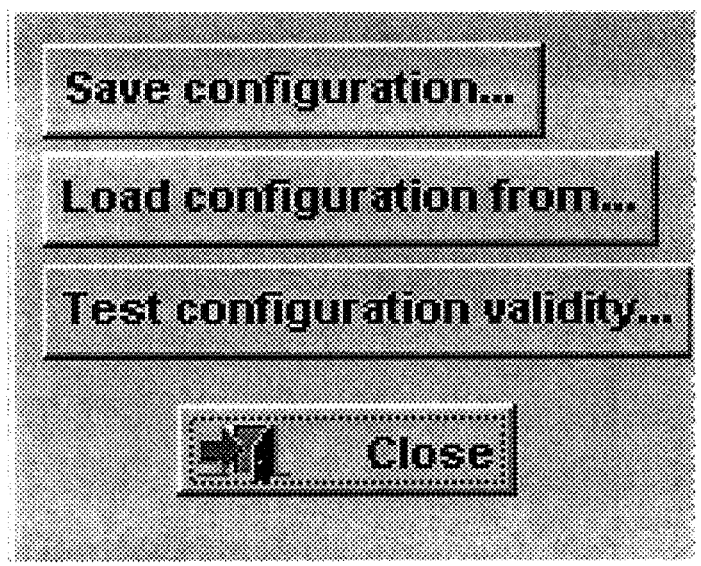
Figure 12S:
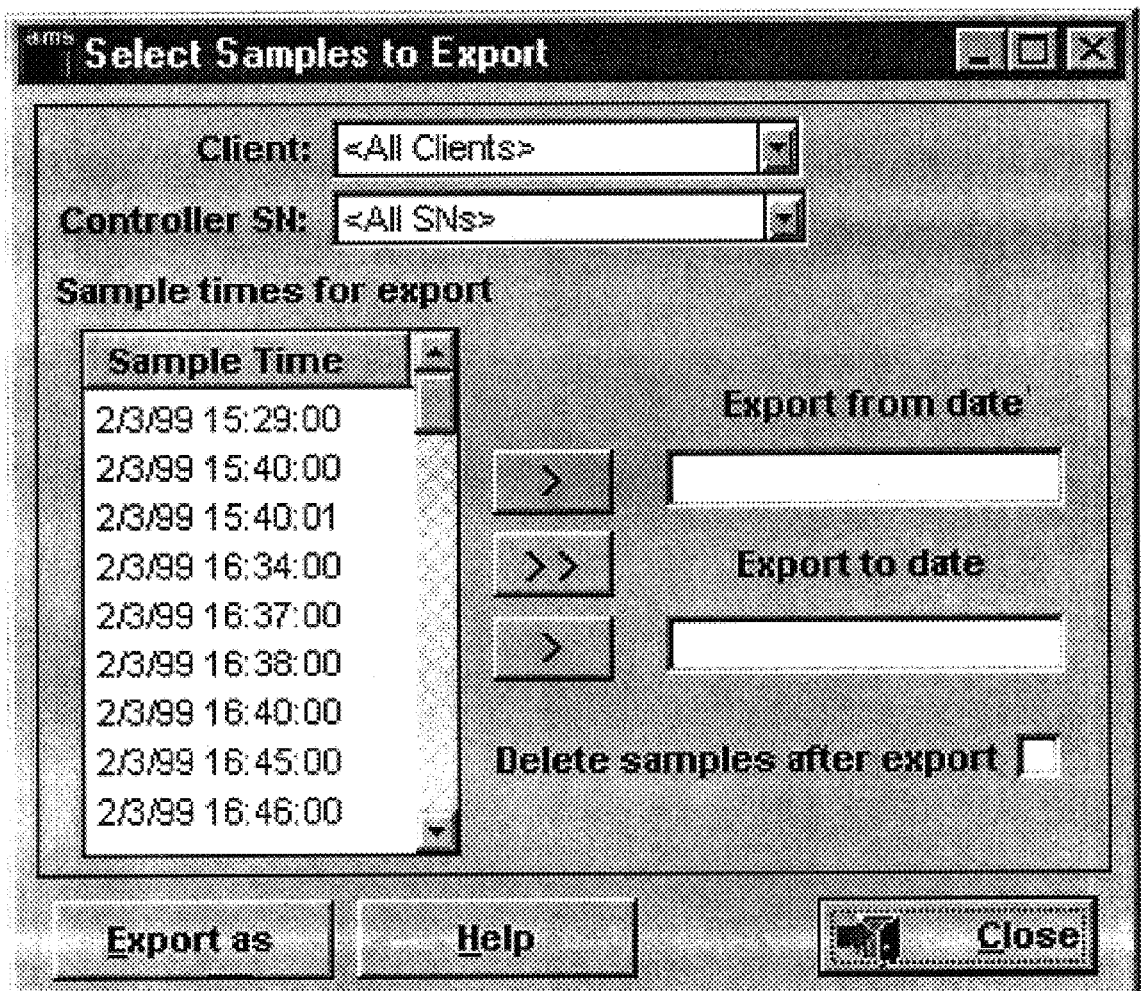
Figure 12T:
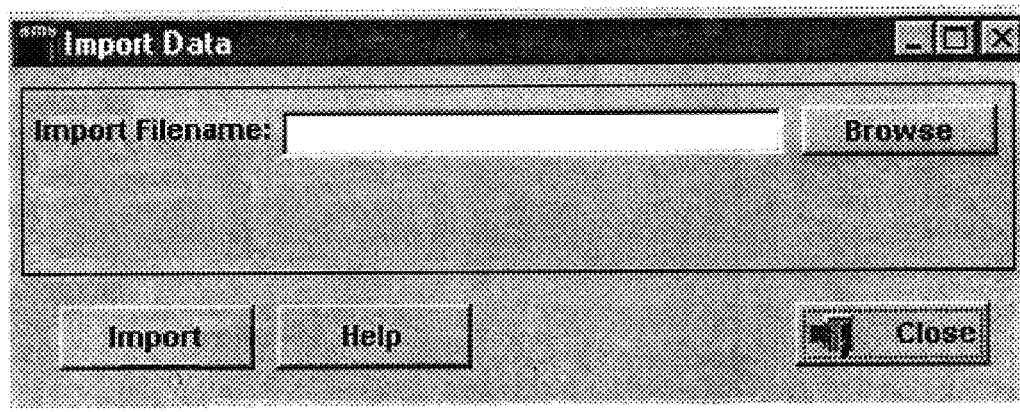
Figure 12V:
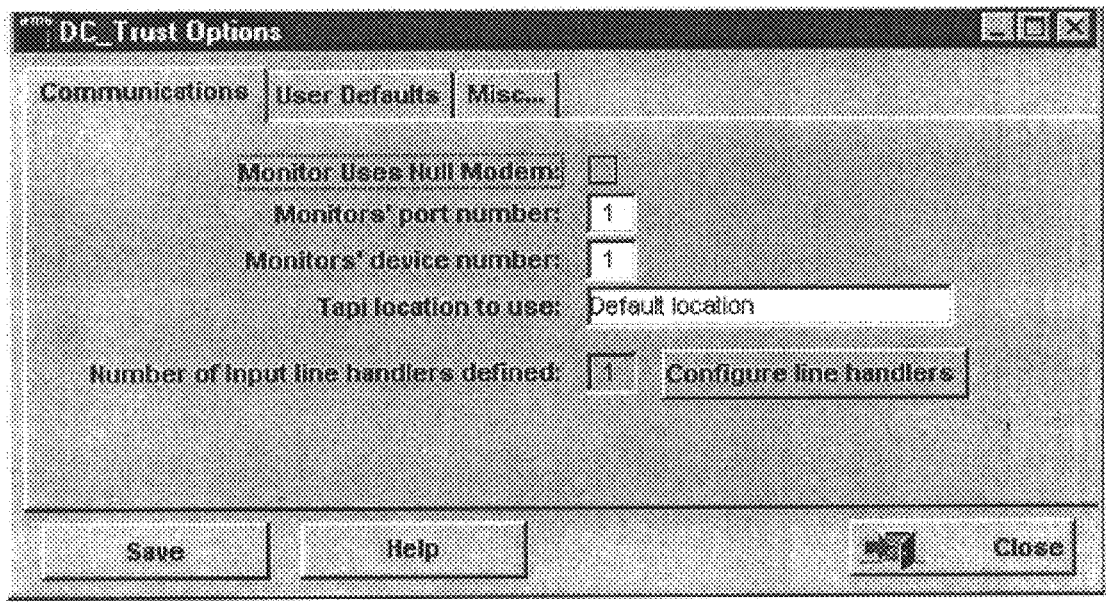
Figure 12V:
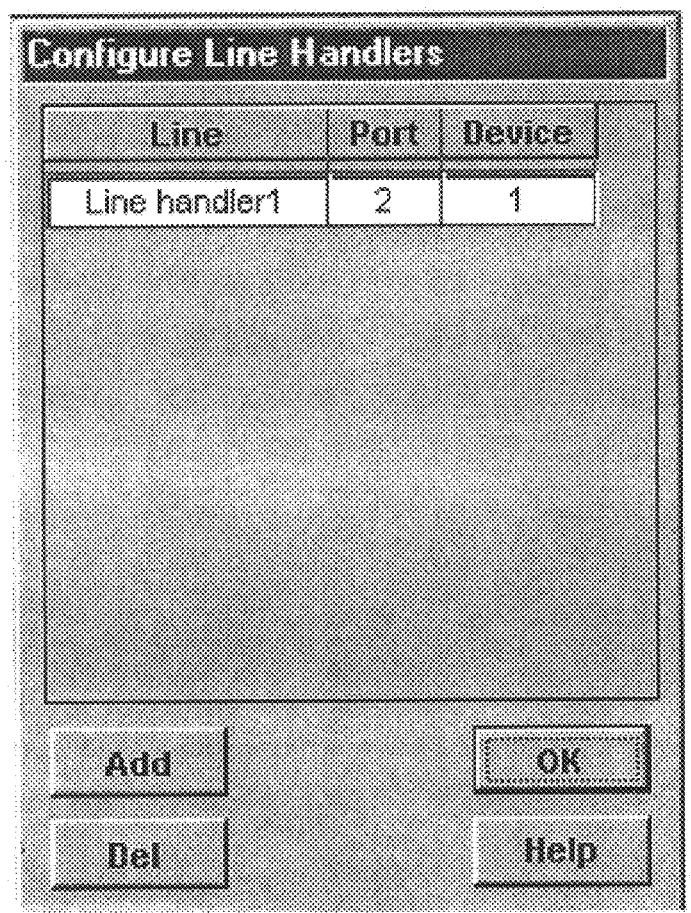
Figure 12W:
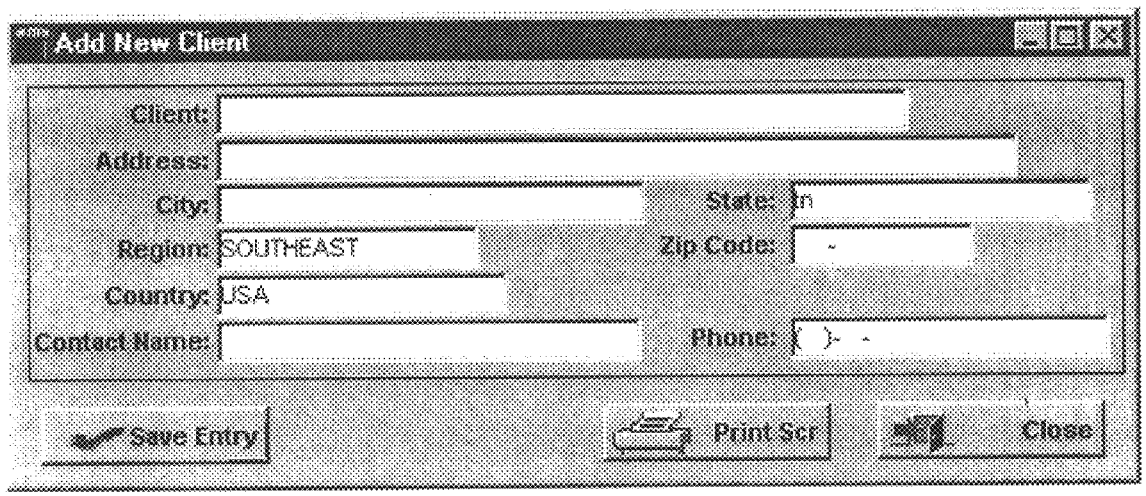

Finally, if the user selects the "remote control" option (FIG. 11C, block 1210), a display as shown in FIG. 12L appears. The latter display is known as the remote control menu, and a very important use of this menu or window is remote control of a specified controller.

Figure 11D:
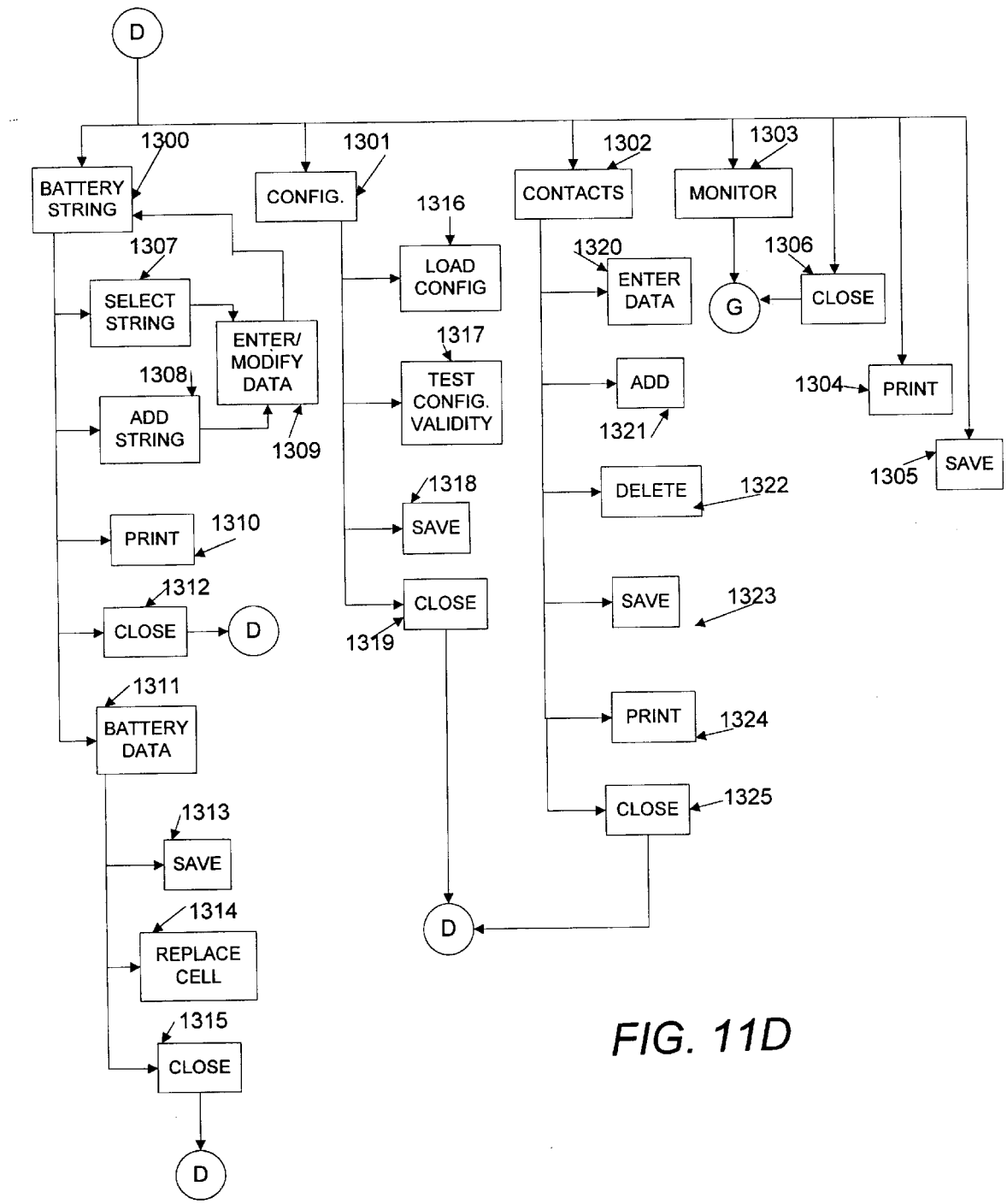
Figure 11E:
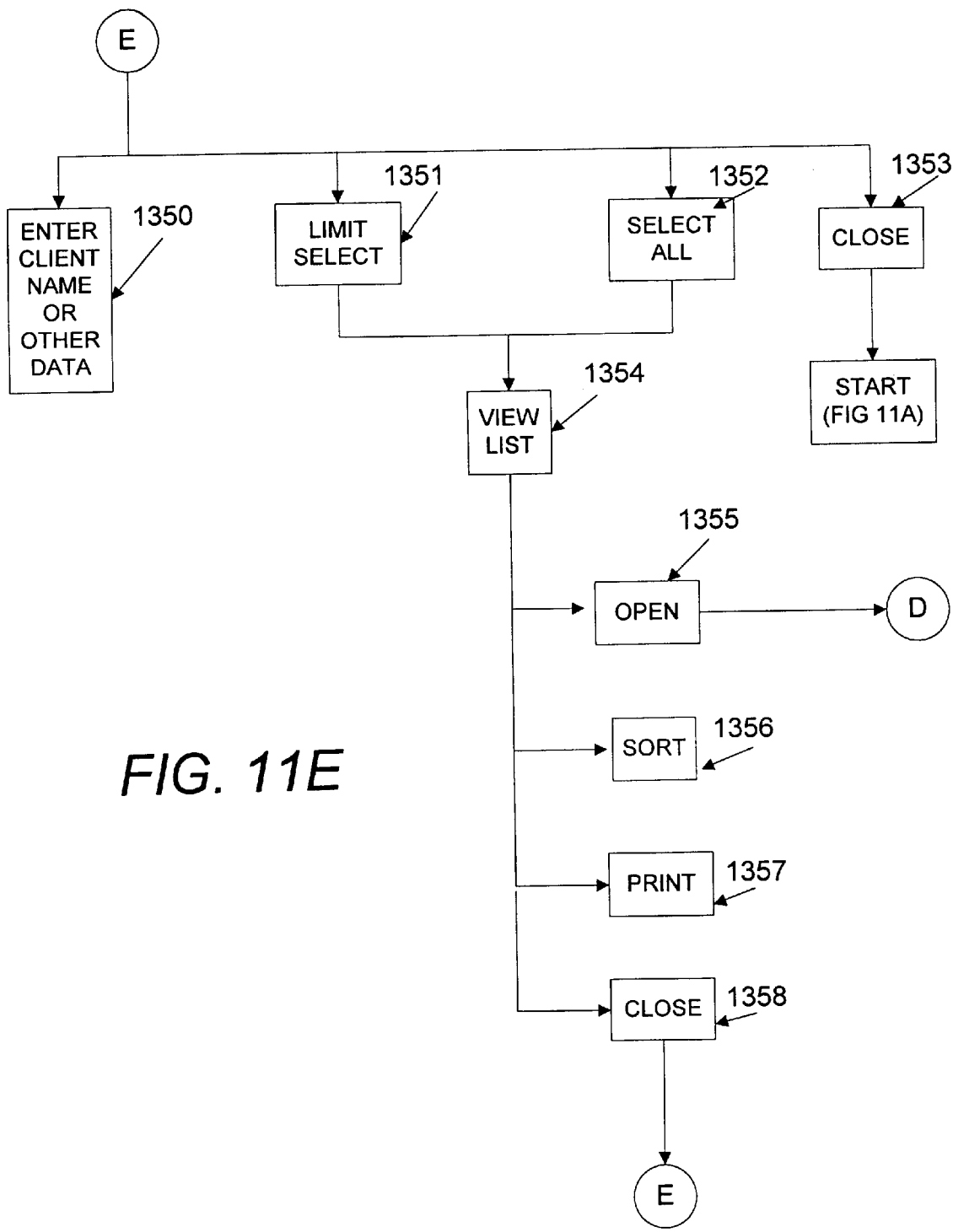
Figure 11F:
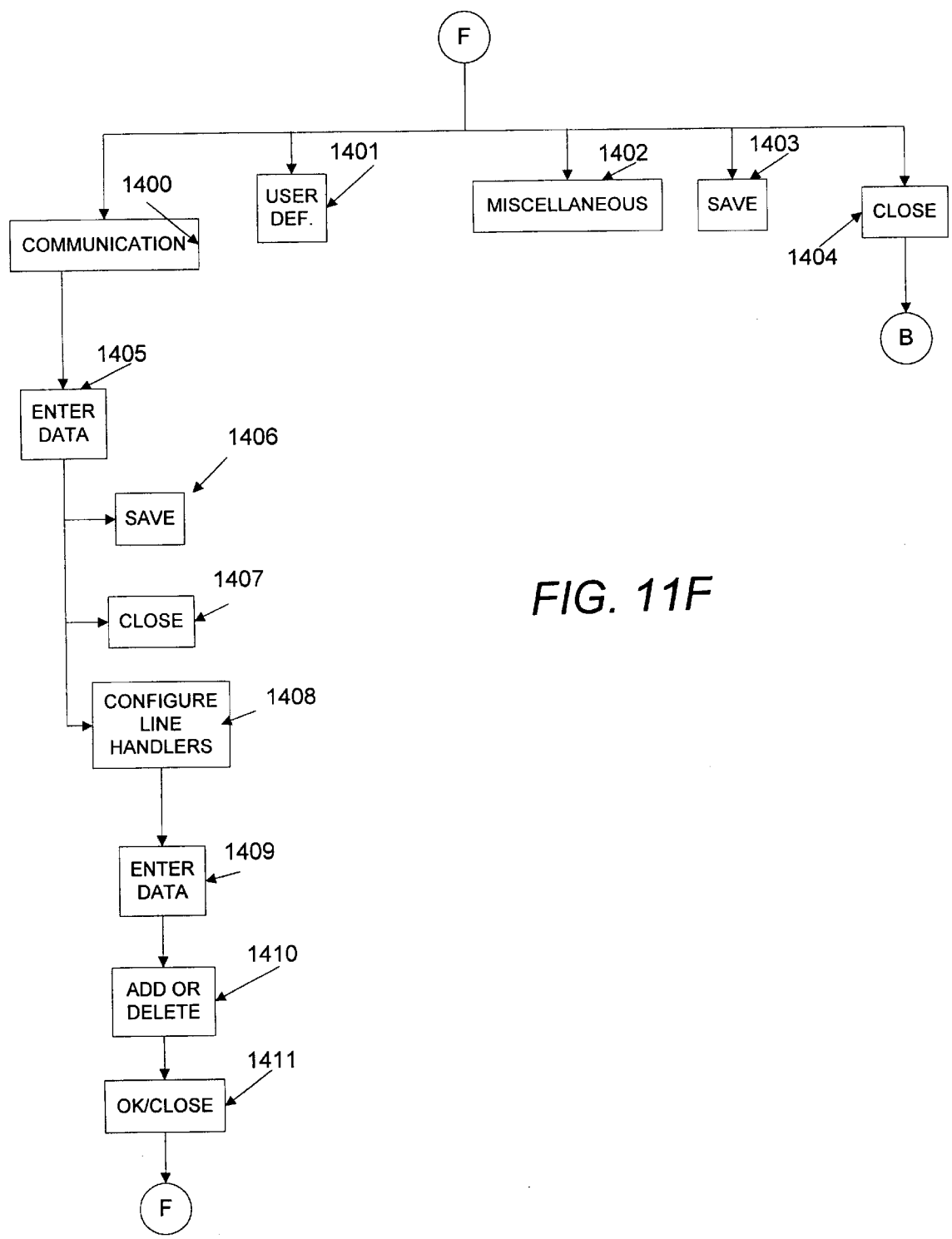
Figure 11G:
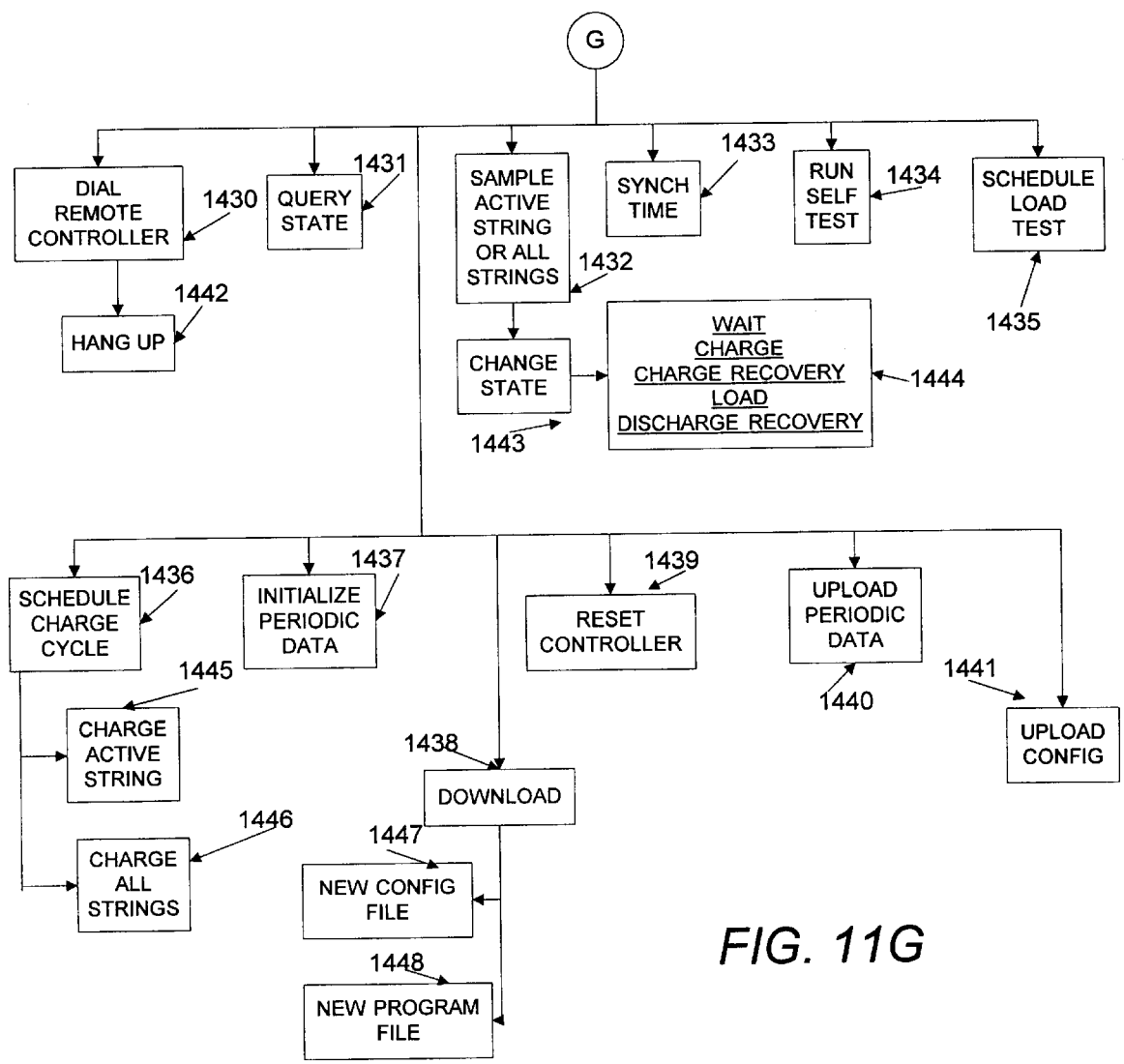

Referring to FIG. 11G, the remote control menu presents various options to the user: dial remote controller, query state, sample active string or all strings, synchronized time, run self test, schedule load test, schedule charge cycle, initialize periodic data, down load, reset controller, up load periodic data, and up load configuration (blocks 1430–1441).

A very important use of this remote control window is remote control of a specified controller. To accomplish this, the operator only has to be viewing the controller on this window. When remote control is desired, the operator simply selects "dial remote controller" (block 1430).

Further referring to FIGS. 11G and 12L, the "remote control" menu enables the user to call the controller, log onto the controller properly, and then retrieve the status of the battery banks. If the controller is in "load test" or "charging" during the log on process, the user will be queried as to whether the operation is to be interrupted to allow for manual control. If an affirmative response to the latter query is rendered, the controller will be placed in manual mode and will await commands from the operator.

In manual mode, the operator can tell the controller what to do and when. As requests are made to the controller, the operator is notified of state changes via a set of displays fields on the bottom of the window (see FIG. 12F). That is to say, sample time is displayed, and the active bank status (string state) and controller status are also displayed. Controller status information relates to the connection, and to whether or not the operator successfully logged onto the controller. To place the controller back in automatic mode, the operator clicks on the "hang-up" button 2003 (FIG. 12E) on the display. Alternatively, the operator can select "hang-up" on the remote control menu of FIG. 12L. The session ends, and the line is dropped.

Operations and selection of options on the remote controller menu of FIG. 12L will now be described with reference to the flowchart of FIG. 11G. The option "dial remote controller" (block 1430) calls the remote controller, as previously discussed. "Hang-up" (block 1442) terminates the connection. "Query state" (block 1431) is used to inquire as to the state of the battery strings. "Change state" (block 1443) changes the controller operating state, those states including the following: wait, charge, charge recovery, load test, and discharge recovery (block 1444). "Down load" (block 1438) sends a new configuration or program file to the controller. "Sample active strings" and "sample all strings" (block 1432) are used to obtain data about the active string and all strings, respectively, with the result that the display of FIG. 12E is modified accordingly. "Synchronize time" (block 1433) is used to resynchronize the timing of the controllers 10, 12 or 14 with the timing of the CMS2 (FIG. 1). "Run self test" (block 1434) is used to run a self test as to the controller in question. "Schedule load test" (block 1435) is used to schedule a load test for all battery strings, while "schedule charge cycle" (block 1436) is used to schedule a charge cycle for a particular string of batteries. "Initialize periodic data" (block 1437) is used to clear all data in the files, that is, to initialize the data in the controller. "Reset controller" (block 1439) is used to de-energize and reboot the controller, that is, to execute a "power on reset" operation with respect to the controller. "Up load periodic data" (block 1440) is used to move data saved or stored in the controller to the CMS. "Up load configuration" (block 1441) is used to transfer data relating to the configuration of the controller to the CMS, and results in appropriate modification of the display of FIG. 12F. Finally, "show communications" and "hide communications" are used to show or not show the progress of communications.

Further considering the flowchart of FIG. 11F, the user saves data by selecting the "save" option (block 1403), and closes the window by selecting the "close" option (block 1404), at which point a return to the top of the flowchart of FIG. 11B is executed, with subsequent display of the window shown in FIG. 12A, as well as the menu shown in FIG. 12B.

Returning to FIGS. 11C and 12D, if the operator selects "clear selected status" (FIG. 11C, block 1201), the display of FIG. 12D is cleared. If the operator selects "controller data" (FIG. 11C, block 1202), the display of FIG. 12M is presented, and the operator is presented with the options set forth in FIG. 11D, blocks 1300–1306.

FIG. 11D is a flowchart of the operations relating to selection of CONTROLLER in FIG. 11A (block 1103) or selection of CONTROLLER DATA in FIG. 11C (block 1202). That is, FIG. 11D outlines the options presented to the user when, in FIG. 11A, CONTROLLER (block 1103) and then ADD CONTROLLER (block 1110) are selected, or when, in FIG. 11C, CONTROLLER DATA (block 1202) is selected.

Referring to FIGS. 11D and 12M, if the operator selects "battery string" (FIG. 11D, block 1300), the display of FIG. 12N is presented. Then, the user is given the option of selecting a particular string of batteries (block 1307), adding a string of batteries (block 1308), printing data (block 1310), displaying battery data (block 1311), or closing the window (block 1312).

If the operator chooses the option of selecting a string (block 1307) or the option of adding a string (block 1308), then the operator is prompted to enter or modify data (block 1309). If the operator chooses the "battery data" option (block 1311), then the display of FIG. 12O is presented. In that case, the operator has the options of saving data (block 1313), replacing the data for a particular cell (block 1314), or closing the window (block 1315).

Further referring to FIG. 11D, if the operator selects "configuration" (block 1301), the display of FIG. 12Q is presented. The operator is then presented with four options: load configuration, test configuration validity, save and close (blocks 1316–1319).

If the operator selects contacts (block 1302), the display of FIG. 12P is presented. In this case, the operator is presented with five options: enter data, add contact, delete contact, save, print screen, and close (blocks 1320–1325).

Further referring to FIGS. 11D and 12M, if the operator selects "monitor" (FIG. 11D, block 1303), the display of FIG. 12E is presented, and the operator is presented with the four options set forth in FIG. 11C, blocks 1200–1203. The logical flow of operations then proceeds in the manner previously discussed in detail with reference to FIGS. 11C and 12D.

Referring to FIG. 11D, print and save options are also provided (blocks 1304 and 1305). It should be noted that, if the operator—in carrying out the operations set forth in FIG. 11D—exercises any of the "close" options (blocks 1312, 1315, 1319 and 1325), a return to the top of the flowchart of FIG. 11D, with consequent redisplay of the window of FIG. 12M, is carried out. If, on the other hand, the operator executes the "close" option in FIG. 12M (see also FIG. 11D, block 1306), then a return to the top of the flowchart of FIG. 11C and presentation of the display of FIG. 12D takes place.

FIG. 11E is a flowchart of the operations relating to selection of CONTROLLER in FIG. 11A. More specifically, FIG. 11E outlines the options presented to the user when, in FIG. 11A, CONTROLLER (block 1103) and then LIST CONTROLLERS (block 1111) are selected.

Figure 12X:
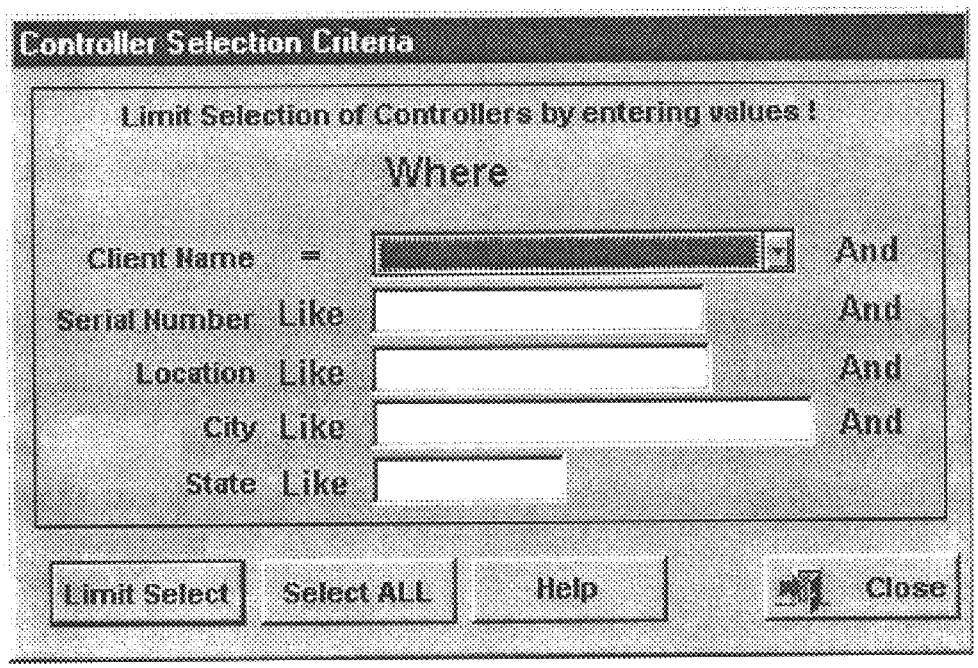
Figures 12Y, 12Z:

As shown in FIGS. 11E and 12X, the user is presented with several options: enter client name or other client data (FIG. 11E, block 1350), limit select (block 1351), select all (block 1352), and close (block 1353).

The option of entering client name or other client data (block 1350) affords the user with the opportunity to limit the selection of controllers in accordance with the data entered. Thus, if only a client name is entered, only those controllers for that particular client will be selected. In order to perform a limited selection of controllers based on the entered data, the operator selects "limit select" (block 1351). If all controllers are to be selected, the operator selects "select all" (block 1352).

In the event that a selection is made, whether limited to specific controllers or designating all controllers, the display of FIG. 12Y is presented. In this display, the operator is presented with a list of all controllers, as well as their cities, states, contact names, and phone numbers. As indicated in FIG. 11E, the display of FIG. 12Y presents the user with several options: open (block 1355), sort (block 1356), print (block 1357) and close (block 1358).

Exercise of the "open" option (block 1355) results in a logical branch to the top of the flowchart of FIG. 11D in conjunction with presentation of the display of FIG. 12M (discussed in detail above). Exercise of the "sort" option (FIG. 11E, block 1356) results in sorting of the data contained in the display of FIG. 12Y. The data can be printed by exercising the "print" option (block 1357), or the window can be closed by exercising the "close" option (block 1358). Upon closing of the window of FIG. 12Y, a return to the top of the flowchart of FIG. 11E and display of FIG. 12X occurs.

With respect to the "sort" option (FIG. 11E, block 1356), the user may sort any column by clicking the column header. The user may also sort on multiple columns by selecting the "sort" button, and selecting from the list presented. If an item selected is subsequently double-clicked, a window appears that allows the user to specify a relationship between or more items, and to modify a numerical value. From the "list clients" window, the user may access the controllers for a client by clicking a row. This activates the "open" button. Clicking the "open" button opens the "view or modify clients" window. The user may modify the information or click "client controllers", and then view a listing of all controllers for this client.

Finally, referring to FIG. 11E, closing of the window of FIG. 12X (see FIG. 11E, block 1353), results in a return to START (block 1100) in FIG. 11A.

FIG. 11F is a flowchart of the operations resulting from selection of the "configure CMS" option (FIG. 11B, block 1125) discussed in general above. When the user selects this option, the display of FIG. 12U(1) is presented, and the user has several options from which to select: communications (FIG. 11F, block 1400), user defaults (block 1401), miscellaneous (block 1402), save (block 1403) and close (block 1404).

Selection of "communications" (block 1400) permits the user to select the CMS communications parameters and to define the line handlers for the system. If the CMS is to be connected to a controller locally through a DB9 connection (that is, through a direct port connection via a DB9-type plug), then the operator selects "Monitor Uses Null Modem" in FIG. 12U(1), and then enters the port and device numbers in the appropriate places in the window of FIG. 12U(1). If the CMS is to communicate via modem with the controller, the port number, device number and telephony application programming interface (TAPI) location are entered. The TAPI location must be the same location entered for the remote dialer, and generally this is the user's name or location.

Once the user enters the communications data (block 1405), "Configure line handlers" can be selected (block 1407), or the data can be saved (block 1406) and the window can be closed (block 1408).

If "Configure line handlers" is selected (block 1407), then the display of FIG. 12V is presented. At this point, the user enters data relating to the line handler (FIG. 11F, block 1409), and also has the option of adding or deleting data (block 1410). Once appropriate data have been added or deleted, the window is closed by selecting "OK" (block 1411), and a return to the top of the flowchart of FIG. 11F is executed with a return to the display of FIG. 12U(1).

If the user selects "user defaults" (FIG. 11F, block 1401), the display of FIG. 12U(2) is presented. The "user default" option permits the user to enter country, state and region.

The defaults will appear automatically in all screens using those fields. This feature saves input time for a large number of controllers in the same region. This information can be changed on an individual screen basis.

If the user selects the "miscellaneous" option (FIG. 11F, block 1402), the display of FIG. 12U(3) is presented. The selection of the "miscellaneous" option defines the directories for the CMS. The information is pre-entered, and preferably reads as follows:

monitor's working directory: c:\dctrust\ directory new controller code: c:\dctrust\ alert processor's directory: c:\dctrust\ alert processor's name: alert.exe line handler's directory: c:\dctrust\line

These directories must be defined in this manner prior to starting the CMS.

Finally, once the user has completed the "communications", "user defaults" and "miscellaneous" options, data are saved (FIG. 11F, block 1403) and the window is closed (block 1404).

Returning to FIG. 11A, if the user selects the CLIENT option (block 1102), the window shown in FIG. 12W is presented. The user is then afforded the opportunity to add a new client to the system (FIG. 11A, block 1105) by entering the appropriate information into the appropriate blocks in the window, and by saving the information (block 1107). The user also has the option of printing the information (block 1108). A client name must be added via the window of FIG. 12W in order to be usable in the controller window (FIG. 11A, block 1103 and FIG. 12Z).

With respect to the CONTROLLER option of FIG. 11A (block 1103) and the controller window of FIG. 12Z, the user is provided with two options: add controller (FIG. 11A, block 1110) or list controllers (block 1111). A controller may be added by selecting "add controller" (FIG. 11A, block 1110). The user then selects a client from a pull down menu. Once the controller record is saved, the field can not be changed. If a change is required, a new controller record must be created. If the user chooses to add a controller, a branch to the top of the flowchart in FIG. 11D is executed, and operation proceeds as previously described with reference to FIG. 11D. If the operator chooses to list controllers, then a branch to the top of the flowchart in FIG. 11E is executed, and the controller selection criteria window of FIG. 12Z is displayed. Operation then proceeds in accordance with the previous discussion relative to FIGS. 11E and 12X.

Further referring to FIGS. 11D and 12M, an address and descriptive location for the controller is entered in the appropriate portions of the window shown in FIG. 12M. This location will appear at the top of the controller and monitor windows after the controller information is saved.

Further referring to FIG. 12M, the user is afforded the opportunity to enter, in appropriate spaces in the window shown in FIG. 12M, the following information: the serial number assigned to the controller; a telephone number at which the controller can be contacted; the telephone numbers for the CMS, as well as an alarm and an alternate alarm contact to be notified in the event of red alarms; a sample frequency and a load test frequency, the combination of which determines the save sample frequency (the load test start date and time and the save sample frequency are automatically calculated, and the next call date and time are cleared). The next call time is calculated by the user clicking on "CALC NEXT CALL". This must be done prior to saving the controller record.

The following further options are presented in the window of FIG. 12M: the number of days that an alert will be muted after being acknowledged, identified as "Alarm Suspension After Alarm" (this prevents an alarm from being reported on subsequent samples from the time that it is acknowledged until the time that the alarm is cleared, and the alarm suspension must be reset after each alarm has cleared such that subsequent alarms are reported); "Periodic Call Enabled" can be selected if automatic, non-alarm reports are desired; "Send New Program File" can be checked if automatic reload of program revisions is required.

The following items in the window of FIG. 12M are pre-entered by the battery system management agency: Vdiff1 gain; Temp gain; Vdiff3 gain; Volts gain; Shunt gain; and common made voltage gain. The controller will recalculate and reenter these numbers automatically after each load test.

The user enters the following information in the appropriate places in the window of FIG. 12M: maximum ambient temperature; charging minutes per month; charging and discharge recovery time; discharge time. After the above information has been entered, the user selects "save entry" to save the data.

While preferred forms and arrangements have been shown in illustrating the invention, it is to be understood that various changes and modifications may be made without departing from the spirit and scope of this disclosure.

We claim:

1. A system for on-line monitoring of battery cells, comprising a central monitoring station and a plurality of controllers connected thereto, wherein each of said controllers is connected to a respective plurality of said battery cells;

wherein each of said controllers monitors and tests said respective plurality of said battery cells, obtains measurement and alarm condition data relative thereto, and transmits said measurement and alarm condition data to said central monitoring station;

wherein said central monitoring station includes display means responsive to operator input for displaying said measurement and alarm condition data for each of said respective plurality of battery cells connected to each of said controllers; and wherein said central monitoring station receives calls from said plurality of controllers, performs analysis of data received from said plurality of controllers, and initiates necessary maintenance requests to resolve problems identified during analysis of said data.

2. The system of claim 1, wherein said central monitoring station includes analyzing processor means for analyzing said measurement and alarm condition data with respect to predetermined criteria in order to identify battery cells which are degrading.

3. The system of claim 2, wherein said display means displays data relating to said battery cells which have failed in a first color, and displays data relating to said battery cells which are degrading in a second color.

4. The system of claim 2, wherein said display means displays data relating to battery cells which are in acceptable condition in a first color, and displays data relating to said battery cells which are degrading in a second color.

5. The system of claim 2, wherein said display means displays data relating to battery cells which are in acceptable condition in a first color, and displays data relating to said battery cells which have failed in a second color.

6. The system of claim 1, wherein said central monitoring station comprises a receiving unit for receiving signals from said plurality of controllers, a dispatching unit for transmitting signals to said plurality of controllers, and an analyzing unit for performing analysis functions based on data received from at least one of said receiving unit, said dispatching unit, and said plurality of controllers.

7. The system of claim 1, wherein said central monitoring station monitors traffic from said plurality of controllers to ensure that all expected calls from said plurality of controllers are received.

8. The system of claim 1, wherein each of said plurality of controllers has a manual mode wherein an operator directs functions performed by each of said plurality of controllers.

9. The system of claim 1, wherein each of said plurality of controllers has an automatic remote mode wherein periodic tests are conducted and periodic test results are transmitted automatically, and alarms are reported automatically, to said central monitoring station.

10. The system of claim 1, wherein each of said plurality of controllers initiates a red alarm call to said central monitoring station immediately following any test conducted by said each of said plurality of controllers wherein a parameter exceeding a red alarm value has been derived.

11. The system of claim 1, wherein said central monitoring station includes storing means for storing a configuration file which includes an identification number and a password for each of said plurality of controllers.

12. The system of claim 1, wherein said central monitoring station initiates calls to any of said plurality of controllers in order to implement preprogrammed parameter changes without waiting for a periodic call from said each of said plurality of controllers.

13. The system of claim 1, wherein each of said plurality of controllers is programmed to make a periodic call to said central monitoring station on a scheduled basis.

14. The system of claim 13, wherein an operator at said central monitoring station initiates a call to one of said plurality of controllers when said one of said plurality of controllers has missed a scheduled periodic call to said central monitoring station.

15. The system of claim 1, wherein an operator at said central monitoring station initiates a diagnostic call to one of said plurality of controllers when said one of said plurality of controllers transmits alarm condition data to said central monitoring station.

16. The system of claim 1, wherein an operator at said central monitoring station initiates a routine investigation call to one of said plurality of controllers when an operational need to make such a call arises.

17. A system for on-line monitoring of battery cells, comprising a central monitoring station and a plurality of controllers connected thereto, wherein each of said controllers is connected to a respective plurality of said battery cells;

wherein each of said controllers monitors and tests said respective plurality of said battery cells, obtains measurement and alarm condition data relative thereto, and transmits said measurement and alarm condition data to said central monitoring station;

wherein said central monitoring station includes display means responsive to operator input for displaying said measurement and alarm condition data for each of said respective plurality of battery cells connected to each of said controllers;

wherein each of said plurality of controllers has at least one of an automatic local mode and a maintenance mode;

wherein, in said automatic local mode, all testing functions are performed by each of said plurality of controllers automatically and alarms are sounded locally; and wherein, in said maintenance mode, saving of measurement data is suspended while maintenance is performed on said batteries by said each of said plurality of controllers.

18. A system for on-line monitoring of battery cells, comprising a central monitoring station and a plurality of controllers connected thereto, wherein each of said controllers is connected to a respective plurality of said battery cells;

wherein each of said controllers monitors and tests said respective plurality of said battery cells, obtains measurement and alarm condition data relative thereto, and transmits said measurement and alarm condition data to said central monitoring station;

wherein said central monitoring station includes display means responsive to operator input for displaying said measurement and alarm condition data for each of said respective plurality of battery cells connected to each of said controllers;

wherein each of said plurality of controllers initiates at least one of a call to said central monitoring station on a periodic basis and a downscale alarm call to said central monitoring station;

said call to said central monitoring station on said periodic basis being initiated to indicate that said each of said plurality of controllers has been active and that the batteries connected to said each of said plurality of controllers are functioning acceptably, and to upload data collected during a preceding period to said central monitoring station; and said downscale alarm call to said central monitoring station being initiated whenever said each of said plurality of controllers detects a condition which prevents accurate testing of said respective plurality of said battery cells connected to said each of said plurality of controllers.

19. A method for on-line monitoring of battery cells by a central monitoring station, said method comprising the steps of:

(a) providing a plurality of controllers connected to said central monitoring station, wherein each of said controllers is connected to a respective plurality of said battery cells;

(b) operating said controllers to monitor and test said respective plurality of said battery cells;

(c) obtaining measurement and alarm condition data relative to said respective plurality of said battery cells;

(d) transmitting said measurement and alarm condition data to said central monitoring station; and (e) displaying said measurement and alarm condition data at said central monitoring station for each of said respective plurality of battery cells connected to each of said controllers;

wherein said method further comprises the steps of receiving calls from said plurality of controllers, performing analysis of data received from said plurality of controllers, and initiating necessary maintenance requests to resolve problems identified during analysis of said data.

20. The method of claim 19, further comprising analyzing said measurement and alarm condition data with respect to predetermined criteria in order to identify battery cells which are degrading.

21. The method of claim 20, further comprising displaying data relating to said battery cells which have failed in a first color, and displaying data relating to said battery cells which are degrading in a second color.

22. The method of claim 20, further comprising displaying data relating to battery cells which are in acceptable condition in a first color, and displaying data relating to said battery cells which are degrading in a second color.

23. The method of claim 20, further comprising displaying data relating to battery cells which are in acceptable condition in a first color, and displaying data relating to said battery cells which have failed in a second color.

24. The method of claim 19, further comprising receiving signals at said central monitoring station from said plurality of controllers, transmitting signals to said plurality of controllers, and performing analysis functions based on data received from said plurality of controllers.

25. The method of claim 19, further comprising the step of monitoring traffic from said plurality of controllers to ensure that all expected calls from said plurality of controllers are received.

26. The method of claim 19, wherein said providing steps comprises providing each of said plurality of controllers with a manual mode wherein an operator directs functions performed by each of said plurality of controllers.

27. The method of claim 19, wherein said providing step comprises providing each of said plurality of controllers with an automatic remote mode wherein periodic tests are conducted and periodic test results are transmitted automatically, and alarms are reported automatically, to said central monitoring station.

28. The method of claim 19, further comprising initiating a red alarm call to said central monitoring station immediately following any test conducted by said each of said plurality of controllers wherein a parameter exceeding a red alarm value has been derived.

29. The method of claim 21, further comprising providing said central monitoring station with a configuration file which includes an identification number and a password for each of said plurality of controllers.

30. The method of claim 19, further comprising initiating calls to any of said plurality of controllers in order to implement preprogrammed parameter changes without waiting for a periodic call from said each of said plurality of controllers.

31. The method of claim 19, further comprising programming each of said plurality of controllers to make a periodic call to said central monitoring station on a scheduled basis.

32. The method of claim 31, further comprising initiating a call to one of said plurality of controllers when said one of said plurality of controllers has missed a scheduled periodic call to said central monitoring station.

33. The method of claim 19, further comprising initiating a diagnostic call to one of said plurality of controllers when said one of said plurality of controllers transmits alarm condition data to said central monitoring station.

34. The method of claim 19, further comprising initiating a routine investigation call to one of said plurality of controllers when an operational need to make such a call arises.

35. A method for on-line monitoring of battery cells by a central monitoring station, said method comprising the steps of:

(a) providing a plurality of controllers connected to said central monitoring station, wherein each of said controllers is connected to a respective plurality of said battery cells;

(b) operating said controllers to monitor and test said respective plurality of said battery cells;

(c) obtaining measurement and alarm condition data relative to said respective plurality of said battery cells;

(d) transmitting said measurement and alarm condition data to said central monitoring station; and (e) displaying said measurement and alarm condition data at said central monitoring station for each of said respective plurality of battery cells connected to each of said controllers;

wherein said providing step comprises providing each of said plurality of controllers with at least one of an automatic local mode and a maintenance mode;

wherein, in said automatic local mode, all testing functions are performed by each of said plurality of controllers automatically and alarms are sounded locally; and wherein, in said maintenance mode, saving of measurement data is suspended while maintenance is performed on said batteries by said each of said plurality of controllers.

36. A method for on-line monitoring of battery cells by a central monitoring station, said method comprising the steps of:

(a) providing a plurality of controllers connected to said central monitoring station, wherein each of said controllers is connected to a respective plurality of said battery cells;

(b) operating said controllers to monitor and test said respective plurality of said battery cells;

(c) obtaining measurement and alarm condition data relative to said respective plurality of said battery cells;

(d) transmitting said measurement and alarm condition data to said central monitoring station; and (e) displaying said measurement and alarm condition data at said central monitoring station for each of said respective plurality of battery cells connected to each of said controllers;

said method further comprising the step of initiating at least one of a call to said central monitoring station from each of said plurality of controllers on a periodic basis and a downscale alarm call to said central monitoring station;

said call to said central monitoring station on said periodic basis being initiated to indicate that said each of said plurality of controllers has been active and that the batteries connected to said each of said plurality of controllers are functioning acceptably, and to upload data collected during a preceding period from said each of said plurality of controllers to said central monitoring station; and said downscale alarm call to said central monitoring station being initiated whenever said each of said plurality of controllers detects a condition which prevents accurate testing of said respective plurality of said battery cells connected to said each of said plurality of controllers.

* * * * *